United States Patent
Hasegawa et al.

(10) Patent No.: US 6,783,874 B2
(45) Date of Patent: Aug. 31, 2004

(54) MAGNETIC SENSOR HAVING SECOND ANTIFERROMAGNETIC LAYERS AND TWO TYPES OF ELECTRODE LAYERS ON FREE MAGNETIC LAYER AND MANUFACTURING METHOD THEREOF

(75) Inventors: Naoya Hasegawa, Niigata-ken (JP); Eiji Umetsu, Niigata-ken (JP); Naohiro Ishibashi, Niigata-ken (JP); Masahiro Oshima, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/405,665

(22) Filed: Apr. 2, 2003

(65) Prior Publication Data

US 2003/0190460 A1 Oct. 9, 2003

(30) Foreign Application Priority Data

Apr. 3, 2002 (JP) ........................................ 2002-101085

(51) Int. Cl.$^7$ ........................... B32B 19/00; G11B 5/33; H01F 3/08; C23C 14/00
(52) U.S. Cl. ...................... 428/692; 428/693; 428/900; 428/928; 360/322; 360/324; 360/324.12; 29/603.07; 29/603.18; 29/DIG. 28; 204/192.1; 204/192.11; 204/192.15; 204/192.34; 216/72
(58) Field of Search .................... 428/692, 693, 428/900, 928; 365/158; 360/324, 322, 324.12; 29/602.1, 603.07, 603.18, DIG. 28; 204/192.1, 192.19, 192.11, 192.34, 192.35; 216/41, 66, 72, 94

(56) References Cited

U.S. PATENT DOCUMENTS 6,178,073 B1 * 1/2001 Hayashi .................. 360/324.11
6,490,139 B1 * 12/2002 Hayashi et al. ............ 360/322

FOREIGN PATENT DOCUMENTS

JP          2001-155313          6/2001

* cited by examiner

Primary Examiner—Donald J. Loney
(74) Attorney, Agent, or Firm—Brinks Hofer Gilson & Lione

(57) ABSTRACT

First electrode layers are formed on second antiferromagnetic layers, and in a step separate from the above, second electrode layers are formed above internal end surfaces of the second antiferromagnetic layers and the first electrode layers and parts of the upper surface of the multilayer film with an additional film provided therebetween. Since the first and the second electrode layers are formed separately, it is not necessary to perform mask alignment twice, and hence an overlap structure can be precisely formed in which the thickness of the second electrode layer at the left side is equivalent to that at the right side.

24 Claims, 19 Drawing Sheets

MAGNETIC SENSOR HAVING SECOND ANTIFERROMAGNETIC LAYERS AND TWO TYPES OF ELECTRODE LAYERS ON FREE MAGNETIC LAYER AND MANUFACTURING METHOD THEREOF

BACKGROUND OF THE INVENTION

1. Field of the Invention

The present invention relates to magnetic sensors in which electrode layers are formed to overlap a multilayer film, and more particularly, relates to a magnetic sensor in which overlap electrode layers at the left and right sides can be precisely formed so that the film thicknesses thereof are equivalent to each other.

2. Description of the Related Art

FIG. 21 is a partly cross-sectional view of a related magnetic sensor (spin-valve type thin-film element) viewed from an opposing face side opposing a recording medium.

Reference numeral 1 indicates a first antiferromagnetic layer composed of a PtMn alloy or the like, and on this first antiferromagnetic layer 1, a fixed magnetic layer 2 formed of a NiFe alloy or the like, a nonmagnetic material layer 3 formed of Cu or the like, and a free magnetic layer 4 formed of a NiFe alloy or the like are provided to form a laminate structure.

As shown in FIG. 21, on the free magnetic layer 4, second antiferromagnetic layers 5 with a track width Tw provided therebetween in the track width direction (X direction in the figure) are formed, and on these second antiferromagnetic layers 5, electrode layers 6 are provided.

In the embodiment shown in FIG. 21, exchange coupling magnetic fields are generated in regions in which the second antiferromagnetic layers 5 are provided on the free magnetic layer 4, the magnetizations of the free magnetic layer 4 in the regions described above are fixed in the X direction shown in the figure, and the free magnetic layer 4 in the track width Tw is put in a weak single domain state so that the magnetization reverse may occur with respect to an external magnetic field.

In the related example shown in FIG. 21, there have been the following two problems. The first problem is that element resistance cannot be satisfactory decreased. The reason for this is that the second antiferromagnetic layer 5 is formed of a material such as a PtMn alloy having a high resistivity, and that sense current flows from the electrode layer 6 to the free magnetic layer 4 side through this second antiferromagnetic layer 5 (the flow of the sense current is shown by the arrows). The PtMn alloy mentioned above has a resistivity of an approximately 170 $\mu\Omega$·cm or more, and on the other hand, the electrode layer 6 is formed of a material such as Au having a very low resistivity of approximately 2 to 6 $\mu\Omega$·cm. Hence, even when a material having a low resistivity is used for the electrode layer 6, according to the structure of the magnetic sensor shown in FIG. 21, the sense current must flow once through the second antiferromagnetic layer 5 having a high resistivity, and as a result, decrease in element resistance cannot be achieved. In addition, since the element height has been decreased concomitant with recent trend toward higher recoding density, the element resistance is also increased.

The second problem is side reading. As described above, since flowing toward the free magnetic layer 4 side through the second antiferromagnetic layer 5, the sense current spreads wider than the track width Tw and then flows toward the free magnetic layer 4 side. In this step, since the magnetization of the free magnetic layer 4 in the vicinity of the track width Tw is not tightly fixed with the second antiferromagnetic layer 5 and varies to some extent with respect to an external magnetic field, a so-called effective track width tends to be larger than the track width Tw (this track width Tw is also referred to as "optical track width" in some cases) shown in the figure. Consequently, the side reading is liable to occur in that external signals are read at positions apart from the track width Tw.

In order to solve the above two problems, the structure in which the electrode layers 6 overlaps the free magnetic layer 4 in the track width Tw has been researched.

FIGS. 22 and 24 are views showing steps of manufacturing a magnetic sensor in which electrode layers form an overlap structure. The views showing the manufacturing steps, described above, are partly cross-sectional views each showing a magnetic sensor in the manufacturing step when viewed from an opposing face side opposing a recording medium.

In the step shown in FIG. 22, the first antiferromagnetic layer 1, the fixed magnetic layer 2, the nonmagnetic material layer 3, and the free magnetic layer 4 are formed in that order from the bottom, and in addition, on the free magnetic layer 4, the second antiferromagnetic layers 5 are formed with a predetermined space T1 provided therebetween in the track width direction (X direction in the figure). For the formation of the second antiferromagnetic layers 5, as shown in FIG. 22, for example, a solid second antiferromagnetic film 5 is first formed over the entire surface of the free magnetic layer 4, resist layers 8 with a predetermined space therebetween in the track width direction are formed on the solid second antiferromagnetic film 5, part of the solid second antiferromagnetic film 5 which is not covered with the resist layers 8 is removed by etching, and the resist layers 8 are then removed, thereby forming the second antiferromagnetic layers 5.

In the step shown in FIG. 23, a solid electrode film 6 is formed on the second antiferromagnetic layers 5 and the free magnetic layer 4, and on the solid electrode film 6, a resist film 7 is formed. In the step shown in FIG. 23, a space for the track width Tw is formed in the resist film 7 in the track width direction (X direction in the figure), thereby forming the resist layers 7. The track width Tw is smaller than the space T1 formed between the second antiferromagnetic layers 5.

In the step shown in FIG. 24, part of the solid electrode film 6 which is not covered with the resist layers 7 is removed by ion milling or reactive ion etching, thereby exposing the upper surface of the free magnetic layer 4. Since the other parts of the solid electrode film 6, which are not removed and which form the electrode layers 6, overlap the upper surfaces of the second antiferromagnetic layers 5 and the free magnetic layer 4, and sense current tends to flow easily from the electrode layers 6 to the free magnetic layer 4 side (the flow of the sense current is indicated by the arrows in FIG. 24), it has been anticipated that the problems described above, that is, the increase in element resistance and the side reading, can be simultaneously solved.

In recent years, the track width TW has been decreased concomitant with the trend toward higher recording density. When the track width Tw is decreased, dead regions (regions which do not directly contribute to reproduction) positioned under the second antiferromagnetic layers 5 and in the very vicinity of both sides of the track width tend to have a larger ratio of the whole area, and as a result, decrease in reproduction output cannot be prevented. However, when the structure is formed so that the electrode layers 6 overlap the free magnetic layer by the manufacturing steps shown in FIGS. 22 to 24, the dead regions can be decreased to some extent as compared to those of the magnetic sensor shown in FIG. 22 since the space between the second antiferromagnetic layers 5 can be increased, and hence it has been expected that the reproduction output can be effectively improved by the structure described above.

In addition, in the structure in which the electrode layers 6 overlap the free magnetic layer 4 while the track width Tw is decreased, as is the magnetic sensor shown in FIG. 24, widths T2 and T3 (hereinafter referred to as "overlap length") of the overlap portions in the track width direction are approximately $\frac{1}{100}\mu m$, and hence the alignment accuracy becomes important when the electrode layers 6 are formed.

However, in the manufacturing steps shown in FIGS. 22 to 24, the second antiferromagnetic layers 5 each having a predetermined shape are first formed using the resist layers 8 in the step shown in FIG. 22, and after the resist layers 8 are removed, in the step shown in FIG. 23, the overlap structure must be formed by the electrode layers 6 again using the resist layers 7.

That is, mask alignment must be performed at least twice, and since the alignment accuracy is approximately $\pm\frac{1}{100}\mu m$ for forming the resist layers 7, when the alignment is deviated by only approximately $\frac{1}{100}\mu m$, the overlap lengths T2 and T3 of the electrode layer 6 at both sides are not equivalent to each other and become significantly different from each other. In addition, in the worst case, one of the electrode layers 6 may be formed so as to overlap the free magnetic layer 4, and the other electrode layer 6 may be formed only on the second antiferromagnetic layer 5 and may not overlap the free magnetic layer 4.

As described above, in the past, it has been considered that the increase in element resistance and the generation of side reading can be suppressed by forming the electrode layers 6 so as to overlap the free magnetic layer 4. However, when the magnetic sensor is actually manufactured, it has been difficult to form equivalent overlap lengths of the electrode layers formed at the left and the right sides since mask alignment must be performed twice, and as a result, the generation of side reading and the increase in element resistance could not be effectively suppressed by the magnetic sensor in which the overlap lengths of the electrode layers at the left and the right are different from each other.

SUMMARY OF THE INVENTION

Accordingly, the present invention was made in order to solve the problems described above, and particularly, an object of the present invention is to provide a magnetic sensor having an overlap structure, in which overlap electrode layers at the left and the right sides have shapes equivalent to each other, and a manufacturing method thereof. The overlap structure mentioned above can be obtained by forming the overlap electrode layers described above separately from electrode layers provided on second antiferromagnetic layers.

A magnetic sensor according to the present invention, which has a multilayer film formed of a first antiferromagnetic layer, a fixed magnetic layer, a nonmagnetic material layer, and a free magnetic layer provided in that order from the bottom, comprises: second antiferromagnetic layers which are disposed with a predetermined space provided therebetween in the track width direction and which are provided on the upper surface of the multilayer film; first electrode layers formed on the respective second antiferromagnetic layers; and second electrode layers disposed with a predetermined space provide therebetween in the track width direction, the second electrode layers being provided directly on or indirectly above at least internal end surfaces in the width direction of the first electrode layers and the second antiferromagnetic layers and parts of the upper surface of the multilayer film.

In the present invention, the first electrode layers are preferably formed in a step separate from that for the second electrode layers.

In the present invention, as described above, the first electrode layers are formed on the second antiferromagnetic layers formed with a predetermined space provided therebetween in the track width direction. In a separate step from that for the first electrode layers, the second electrode layers are formed directly on or indirectly above the internal end surfaces of the first electrode layers and the second antiferromagnetic layers and parts of the upper surface of the multilayer film. That is, the second electrode layers each directly or indirectly overlap the upper surface of the multilayer film.

According to one embodiment of the present invention, since the second electrode layers at the left and the right sides can be formed so as to symmetrically overlap the upper surface of the multilayer, decrease in element resistance and reduction of side reading can be effectively achieved even when the track has been narrowed. In addition, the reproduction output can be more effectively improved as compared to that in the past.

In the present invention, since the first electrode layers are formed in a step separate from that for the second electrode layers, the first electrode layers may be formed of a material different from that for the second electrode layers. As a result, for example, the first electrode layers may be formed of a material having ductility lower than that of the second electrode layers.

When the first electrode layer and the second electrode layer are both formed of a soft material, such as Au, having high ductility, and when polishing is performed in a slider-forming step or the like, smearing occurs, and hence short circuiting occurs between the electrode layer and an upper shield layer or a lower shield layer, resulting in destruction of reproduction functions of the magnetic sensor. It is important that the second electrode layers forming the overlap structure have high conductivity, and according to the structure of the present invention, even when the first electrode layer has conductivity lower than that of the second electrode layer, the reproduction characteristics are not so much degraded. In addition, the area in which the first electrode layer is formed tends to be larger than that in which the second electrode layer is formed. Accordingly, when the first electrode layer is formed of a material having ductility lower than that of the second electrode layer, the generation of smearing can be effectively suppressed.

In the present invention, the first electrode layer is preferably formed of at least one of Cr, Rh, Ru, Ta, and W, or an alloy of Au containing at least one of Pd and Cr, and the second electrode layer is preferably formed of at least one of Au, Cu, and Ag.

In addition, in the present invention, the second electrode layers are preferably formed only on the internal end surfaces and the parts of the upper surface of the multilayer film.

In the present invention, stop layers are preferably provided under the second electrode layers and are preferably composed of a material having an etching rate lower than that of the second electrode layers.

The stop layers are preferably formed of at least one element selected from the group consisting of Ta, Cr, V, Nb, Mo, W, Fe, Co, Ni, Pt, and Rh. The stop layers each preferably have a laminate structure composed of a Cr layer and a Ta layer provided in that order from the bottom.

In the present invention, the internal end surfaces of the second antiferromagnetic layers and the respective internal end surfaces of the first electrode layers preferably form continuous surfaces.

A method for manufacturing a magnetic sensor, according to the present invention, comprises the following steps. The steps are: step (a) of forming a multilayer film including a first antiferromagnetic layer, a fixed magnetic layer, a nonmagnetic material layer, and a free magnetic layer provided in that order on a substrate; step (b) of forming second antiferromagnetic layers, which are disposed on two side portions of the multilayer film in the track width direction, and first electrode layers on the second antiferromagnetic layers; and step (c) of forming second electrode layers directly on or indirectly above at least internal end surfaces in the track width direction of the first electrode layers and the second antiferromagnetic layers and parts of the upper surface of the multilayer film, the second electrode layers being provided with a predetermined space provided therebetween in the width direction.

According to steps (a) to (c), the first electrode layers and the second electrode layers can be formed in separate steps, and since it is not necessary to perform mask alignment twice as was in the past, an overlap structure can be precisely formed in which overlap lengths, which are the thickness of the electrodes, at the left and the right sides are equivalent to the other.

According to the present invention, a method for manufacturing a magnetic sensor, comprises: step (a) of forming a multilayer film including a first antiferromagnetic layer, a fixed magnetic layer, a nonmagnetic material layer, and a free magnetic layer provided in that order on a substrate; step (b) of forming second antiferromagnetic layers, which are disposed on two side portions of the multilayer film in the track width direction, and first electrode layers on the second antiferromagnetic layers; step (d) of forming a solid second electrode film on the upper surfaces of the first electrode layers, internal end surfaces in the track width direction of the first electrode layers and the second antiferromagnetic layers, and the upper surface of the multilayer film; and step (e) of removing a center part of the solid second electrode film formed on the upper surface of the multilayer film, whereby second electrode layers with a predetermined space provided therebetween in the track width direction are formed on the internal end surfaces and parts of the upper surface of the multilayer film.

In steps (d) and (e), mask alignment of a resist performed in the past is not necessary, and the second electrode layers can be formed in a step separate from that for the first electrode layers so that the overlap lengths at the left and the right sides are equivalent to each other.

The method for manufacturing a magnetic sensor, according to the present invention, may further comprise forming a solid stop film on the upper surfaces of the first electrode layers, the internal end surfaces in the track width direction of the first electrode layers and the second antiferromagnetic layers, and the upper surface of the multilayer film after step (b) is performed; and after a part of the solid stop film is exposed by removing the center part of the solid second electrode film in step (e), removing the part of the solid stop film.

In the present invention, the solid stop film is preferably formed of a material having an etching rate lower than that of the solid second electrode film. In particular, the solid stop film is preferably formed of at least one element selected from the group consisting of Ta, Cr, V, Nb, Mo, W, Fe, Co, Ni, Pt, and Rh. In addition, the solid stop film is more preferably formed of a Cr layer and a Ta layer provided in that order from the bottom.

When the center part of the solid second electrode film formed on the multilayer film is removed in step (e), the multilayer film may be damaged by overetching in some cases in this step. Accordingly, in the case in which the solid stop film is provided in order to avoid the damage described above, even when the solid second electrode film formed on the solid stop film is removed by etching, and over etching is then further performed, the multilayer film is prevented from being damaged by the etching.

In the present invention, it is preferable that the solid second electrode film provided on the upper surfaces of the first electrode layers be entirely removed in step (e).

In the present invention, in step (d), the solid second electrode film is preferably formed by sputtering with a sputtering angle inclined from the direction perpendicular to the substrate so that the thickness thereof on the internal end surfaces is larger than each of those on the upper surface of the multilayer film and on the upper surfaces of the first electrode layers.

The difference in thickness at the individual positions of the solid second electrode film formed by sputtering is significantly important. As described above, when the solid second electrode film is sputtered, the thickness thereof on the internal end surfaces must be larger than each of those on the upper surface of the multilayer film and on the upper surfaces of the first electrode layers.

In step (e), the center part of the solid second electrode film, which is formed on the upper surface of the multilayer film with or without another layer provided therebetween, is removed, and in this step, parts of the solid second electrode film formed on the internal end surfaces are also removed. However, in the present invention, the solid second electrode film formed on the internal end surfaces must remain for forming the second electrode layers. Accordingly, when the thickness of the solid second electrode film on the internal end surfaces is smaller than that on the upper surface of the multilayer film, before the solid second electrode film on the upper surface of the multilayer film is entirely removed, the solid second electrode film formed on the internal end surfaces may be removed faster than that described above in some cases. Hence, in the present invention, the solid second electrode film, which is to be formed into the second electrode layers, is formed by sputtering with a sputtering angle inclined from the direction perpendicular to the substrate, and as a result, the thickness of the solid second electrode film on the internal end surfaces is larger than each of those on the upper surface of the multilayer film and on the upper surfaces of the first electrode layers.

In the present invention, when the solid second electrode film is formed in step (d), the thickness thereof on the upper surface of the multilayer film is preferably smaller than each of those on the upper surfaces of the first electrode layers.

In the present invention, in step (e) of removing the center part of the solid second electrode film formed on the upper surface of the multilayer film by milling, the milling angle is preferably set close to perpendicular to the substrate as compared to the sputtering angle used for forming the solid second electrode film.

Accordingly, since the center part of the solid second electrode film can be appropriately removed, the second electrode layers having a predetermined thickness can be formed on the internal end surfaces, and hence the overlap structure can be precisely formed in which the thicknesses of the second electrode layers at the left side and the right side are equivalent to each other.

In addition, in the present invention, the first electrode layers are preferably formed of a nonmagnetic conductive material different from that for the second electrode layers. Furthermore, the first electrode layers are preferably formed of a material having ductility lower than that for the second electrode layers.

In the present invention, the first electrode layers are preferably formed of at least one of Cr, Rh, Ru, Ta, and W, or an alloy of Au containing at least one of Pd and Cr, and the second electrode layers are preferably formed of at least one of Au, Cu, and Ag.

DESCRIPTION OF THE PREFERRED EMBODIMENTS

Figure 1:
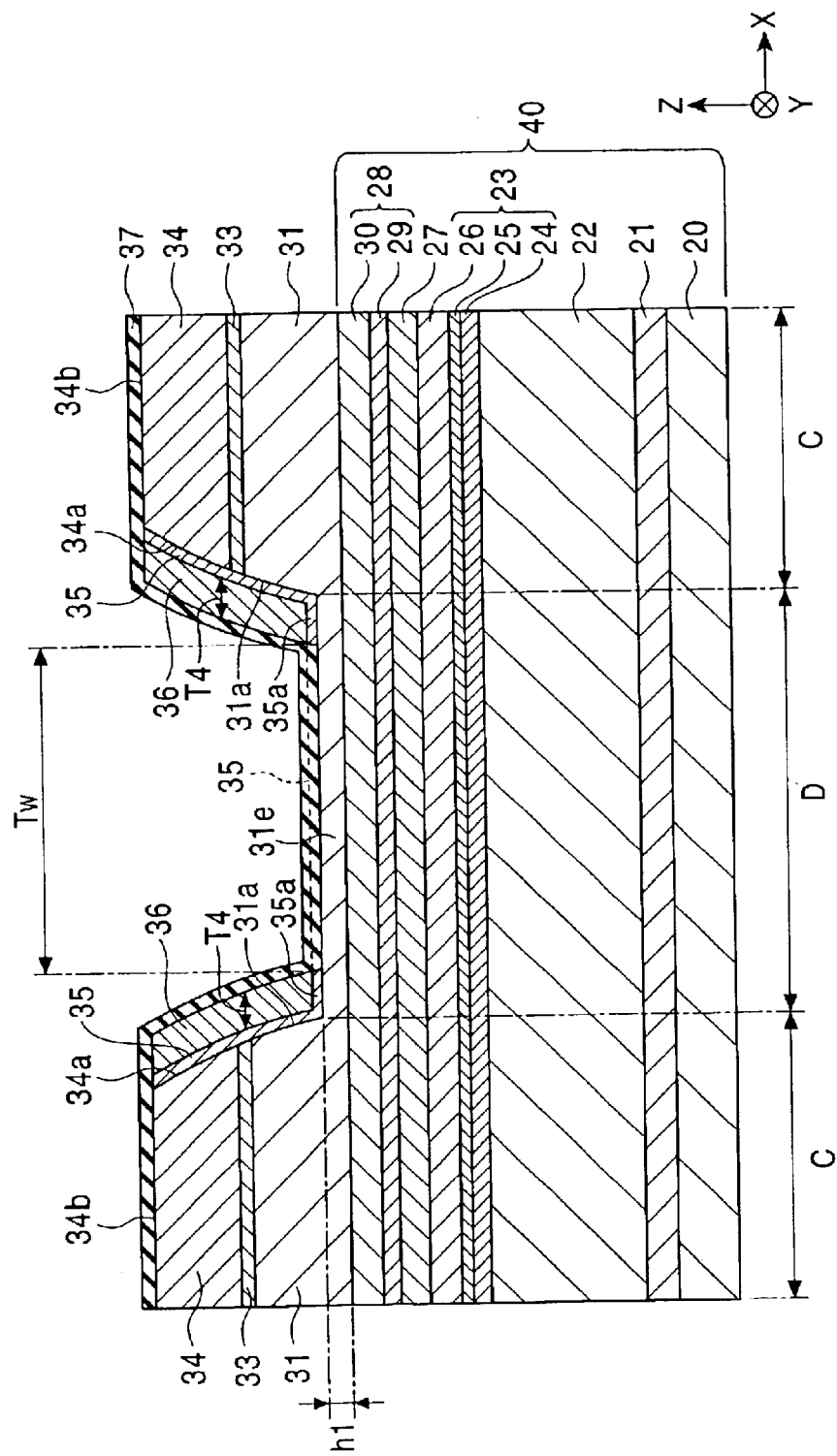
FIG. 1 is a partly cross-sectional view showing the structure of a magnetic sensor according to a first embodiment of the present invention, the sensor being viewed from an opposing face side opposing a recording medium.

FIG. 1 is a partly cross-sectional view of the structure of a magnetic sensor (spin-valve type thin-film element) of the present invention, the sensor being viewed from an opposing face side opposing a recording medium.

Reference numeral 20 indicates a substrate. On the substrate 20, a seed layer 21 formed of a NiFe alloy, a NiFeCr alloy, Cr, or the like is provided. The seed layer 21 is composed, for example, of 60 atomic percent of $Ni_{0.8}Fe_{0.2}$ and 40 atomic percent of Cr and has a thickness of 60 Å.

On the seed layer 21, a first antiferromagnetic layer 22 is formed. The first antiferromagnetic layer 22 is formed of, for example, a PtMn alloy, an X—Mn alloy (X is at least one element selected from the group consisting of Pd, Ir, Rh, Ru, Os, Ni, and Fe), or a Pt—Mn—X' alloy (X' is at least one element selected from the group consisting of Pd, Ir, Rh, Ru, Au, Ag, Os, Cr, Ni, Ar, Ne, Xe, and Kr).

As the first antiferromagnetic layer 22, when the alloy described above is used, and heat treatment is then performed, an exchange coupling film of the first antiferromagnetic layer 22 and a fixed magnetic layer 23, which generated a strong exchange coupling magnetic field, can be obtained. In particular, when a PtMn alloy is used, the exchange coupling film formed of the first antiferromagnetic layer 22 and the fixed magnetic layer 23 can be obtained which has an exchange coupling magnetic field of 48 kA/m or more, such as more than 64 kA/m, and an extremely high blocking temperature of 380° C. at which the exchange coupling magnetic field disappears.

The alloys described above are each an irregular crystal having the face-centered cubic (fcc) structure right after the film formation and is then transformed into a CuAuI type regular crystal having the face-centered tetragonal (fct) structure by heat treatment.

The film thickness of the first antiferromagnetic layer 22 around the center in the track width direction is in the range of from 80 to 300 Å.

On the first antiferromagnetic layer 22, the fixed magnetic layer 23 is formed. The fixed magnetic layer 23 has an artificial ferrimagnetic structure. The fixed magnetic layer 23 has a three-layer structure composed of magnetic layers 24 and 26 and a nonmagnetic interlayer 25 provided therebetween.

The magnetic layers 24 and 26 are formed of a magnetic material, such as a NiFe alloy, Co, a CoNiFe alloy, a CoFe alloy, or a CoNi alloy. The magnetic layers 24 and 26 are preferably formed of the same material.

In addition, the nonmagnetic interlayer 25 is formed of a nonmagnetic material comprising at least one of Ru, Rh, Ir, Cr, Re, Cu, and an alloy containing at least one element mentioned above. In particular, the nonmagnetic interlayer 25 is preferably formed of Ru.

On the fixed magnetic layer 23, a nonmagnetic material layer 27 is formed. The nonmagnetic material layer 27 is a layer which interferes with magnetic coupling between the fixed magnetic layer 23 and a free magnetic layer 28, which allows sense current to primarily flow therethrough, and which is preferably formed of a conductive nonmagnetic material such as Cu, Cr, Au, or Ag. In particular, the nonmagnetic material layer 27 is preferably formed of Cu.

On the nonmagnetic material layer 27, the free magnetic layer 28 is formed. In the embodiment shown in FIG. 1, the free magnetic layer 28 has a two-layer structure. Reference numeral 29 indicates a diffusion-blocking layer formed of Co, CoFe, or the like. This diffusion-blocking layer 29 inhibits the mutual diffusion between the free magnetic layer 28 and the nonmagnetic material layer 27. In addition, on this diffusion-blocking layer 29, a magnetic material layer 30 formed of a NiFe alloy or the like is provided.

Hereinafter, the laminate formed of from the substrate 20 to the free magnetic layer 28 is called a multilayer film 40.

On the free magnetic layer 28, second antiferromagnetic layers 31 are formed. As is the first antiferromagnetic layer 22, the second antiferromagnetic layers 31 are each formed of, for example, a PtMn alloy, an X—Mn alloy (X is at least one element selected from the group consisting of Pd, Ir, Rh, Ru, Os, Ni, and Fe), or a Pt—Mn—X' alloy (X' is at least one element selected from the group consisting of Pd, Ir, Rh, Ru, Au, Ag, Os, Cr, Ni, Ar, Ne, Xe, and Kr).

The second antiferromagnetic layers 31 are disposed with a space provided therebetween in the track width direction; however, as shown in FIG. 1, a connecting layer 31e having a small thickness as compared to that of each of the second antiferromagnetic layers 31 may be provided therebetween and may be formed of the same material as that for the second antiferromagnetic layers 31. In the embodiment shown in FIG. 1, the case will be described in which the second antiferromagnetic layers 31 are provided at two side portions C, the connecting portion 31e is provided at a center portion D, and since the material for the second antiferromagnetic layers 31 is the same as that for the connecting layer 31e, these three layers are formed simultaneously.

In the embodiment shown in FIG. 1, on the two second antiferromagnetic layers 31 at the two side portions C, first stop layers 33 formed of Ta, Cr, or the like are provided. As shown in FIG. 1, on the first stop layers 33, first electrode layers 34 are formed.

In this embodiment, internal end surfaces 34a of the first electrode layers 34 in the track width direction and respective internal end surfaces 31a of the second antiferromagnetic layers 31 in the track width direction form continuous surfaces. In the embodiment shown in FIG. 1, the distances between the internal end surfaces 31a of the second antiferromagnetic layers 31 and between the internal end surfaces 34a of the first electrode layers 34 are gradually increased from the lower side to the upper side, thereby forming inclined surfaces or curved surfaces at the two sides in the track width direction.

As shown in FIG. 1, on the internal end surfaces 34a of the first electrode layers 34 and the respective internal end surfaces 31a of the second antiferromagnetic layers 31, second stop layers 35 are formed. The second stop layers 35 are formed of Cr, Ta, or the like. In addition, internal front portions 35a of the second stop layers 35 extend to the surface of the connecting layer 31e provided between the second antiferromagnetic layers 31.

In the embodiment shown in FIG. 1, on the second stop layers 35, second electrode layers 36 are formed. That is, the second electrode layers 36 are each continuously formed on the internal end surfaces 34a and 31a of the first electrode layer 34 and the second antiferromagnetic layer 31 and part of the upper surface of the multilayer film 40 with an additional layer provided therebetween. In FIG. 1, the track width Tw is defined by a space between the second electrode layers 36 in the track width direction (X direction in the figure).

In the embodiment shown in FIG. 1, a protective layer 37 is continuously formed on upper surfaces 34b of the first electrode layers 34, the second electrode layers 36, and the upper surface of the connecting layer 31e which is provided at the center portion D and between the antiferromagnetic layers 31.

The features of the magnetic sensor according to the embodiment shown in FIG. 1 will be described.

In the embodiment shown in FIG. 1, the second antiferromagnetic layers 31 at the two side portions C on the multilayer film 40 and the connecting layer 31e at the central portion D thereon are formed, and above the second antiferromagnetic layers 31 at the two side portions C, the first electrode layers 34 are formed with the first stop layers 33 provided therebetween. The second electrode layers 36 formed in a step separate from that for the first electrode layers 34 are each continuously formed above (that is, to overlap) the internal end surface 34a of the first electrode layer 34, the internal end surface 31 of the second antiferromagnetic layer 31, and the upper surface of the multilayer film 40 with other layers (which indicate the second stop layer 35 and the connecting layer 31e) provided therebetween, and the space between the second electrode layers 36 in the track width direction (X direction in the figure) defines the track width Tw.

Figure 24:
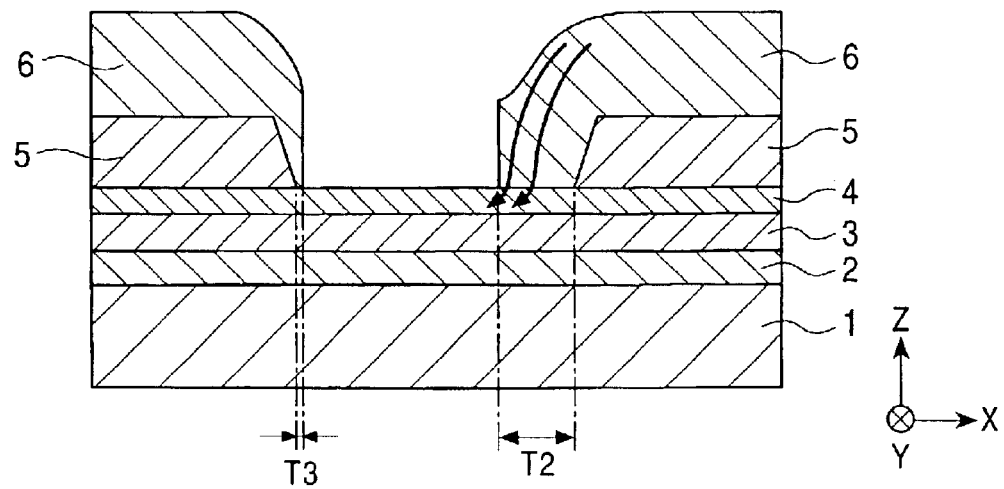
FIG. 24 is a schematic view showing a step following the step in FIG. 23.

The difference of the magnetic sensor of this embodiment from the related example shown in FIG. 24 is that one type of electrode layer 6 is formed so as to overlap the multilayer film from the second antiferromagnetic layer 5 side in the example shown in FIG. 24, and on the other hand, in the present invention, the first electrodes 34 provided on the second antiferromagnetic layers 31 at the two side portions C are formed separately from the second electrode layers 36 which overlap the multilayer film 40.

As described later in detail, in the manufacturing method of the present invention, mask alignment of a resist layer for forming the second electrode layers 36 is not necessary, and as a result, the second electrode layers 36 disposed with a predetermined space therebetween in the track width direction can be precisely formed so as to have thicknesses T4 thereof equivalent to each other even when a narrower track is formed. The thickness T4 corresponds to the overlap length and is preferably in the range of from 50 to 500 Å.

Figure 23:
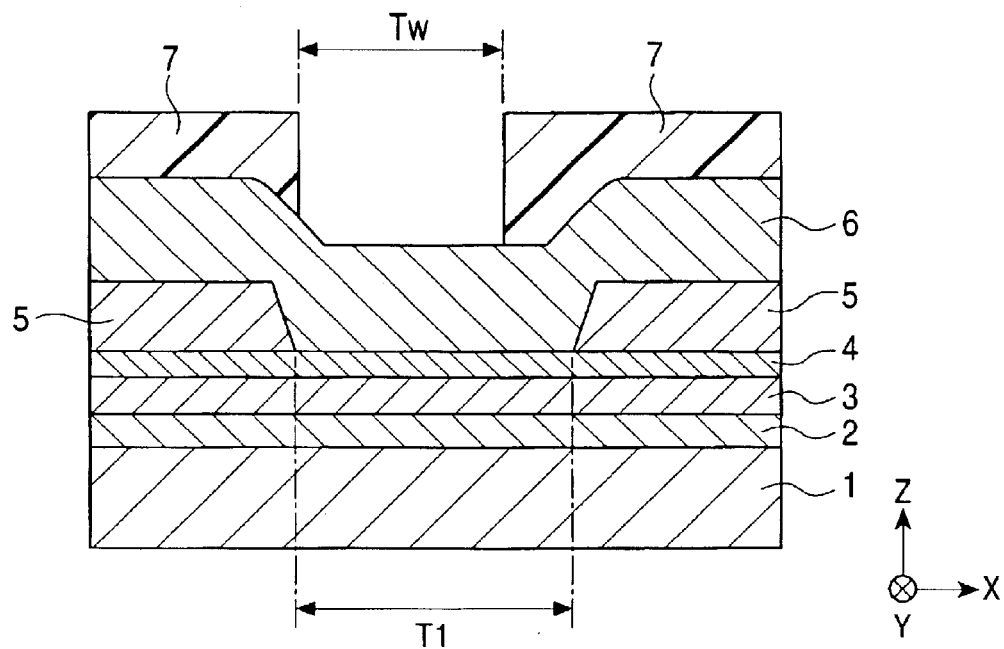
FIG. 23 is a schematic view showing a step following the step in FIG. 22.

According to the present invention, compared to the related example shown in FIG. 23, the decrease in element resistance and reduction of generation of side reading can be effectively achieved. In addition, by forming the overlap structure in which the thicknesses of the electrodes disposed with a predetermined space therebetween are equivalent to each other, the reproduction output can be effectively improved as compared to that of the related example shown in FIG. 23.

In addition, in the present invention, since the first electrode layers 34 and the second electrode layers 36 can be formed separately, the first electrode layers 34 can be formed of a material different from that for the second electrode layers 36. Hence, materials for the first electrode layer 34 and the second electrode layer 36 can be more freely selected.

In the present invention, the second electrode layers 36 are preferably formed of a nonmagnetic conductive material having high conductivity. For example, the second electrode layers 36 are preferably formed of at least one of Au, Cu, Ag, and the like. The reason the second electrode layers 36 preferably have high conductivity is that sense current is allowed to easily flow through the second electrode layers 36 to the multilayer film 40 side.

In addition, the first electrode layers 34 also preferably have high conductivity; however, in this embodiment, since the first layers do not overlap the multilayer film 40, the conductivity of the first electrode layers 34 may be lower than that of the second conductive layers 36. However, the conductivity of the first electrode layers 34 is preferably higher than that of the second antiferromagnetic layers 31.

In the case in which the first electrode layer 34 is formed of a material such as Au having high conductivity, as is the second electrode layer 36, when the surface of the first electrode layer 34 is polished in a slider-forming step, smearing of the electrode layer may occur since Au has high ductility. Since the area in which the smearing occurs is preferably reduced as small as possible for improving the reproduction output, and the area in which the first electrode layer 34 is formed tends to be larger than that of the second electrode layer 36, the first electrode layer 34 which is not so much required to have high conductivity as compared to the second electrode layer 36 is preferably formed of a nonmagnetic conductive material having low ductility instead of that having high conductivity. The first electrode layer 34 is preferably formed of at least one of Cr, Rh, Ru, Ta, and W, or an alloy of Au containing at least one of Pd and Cr. However, when the smearing may not cause any problem in the area in which the first electrode layer 34 is formed, the first electrode layer 34 may be formed of a nonmagnetic conductive material similar to that for the second electrode layer 36. The degree of "ductility" can be measured by a "ductility test"; however, when the material is in the form of a thin film as in the present invention, the "ductility" cannot be measured. Hence, selection may be performed by measuring the degree of ductility of a material in the bulk form to be used for the electrode layer, or materials for the first and the second electrode layers 34 and 36 may be selected based on general chemical information already disclosed in papers and the like.

Figure 2:
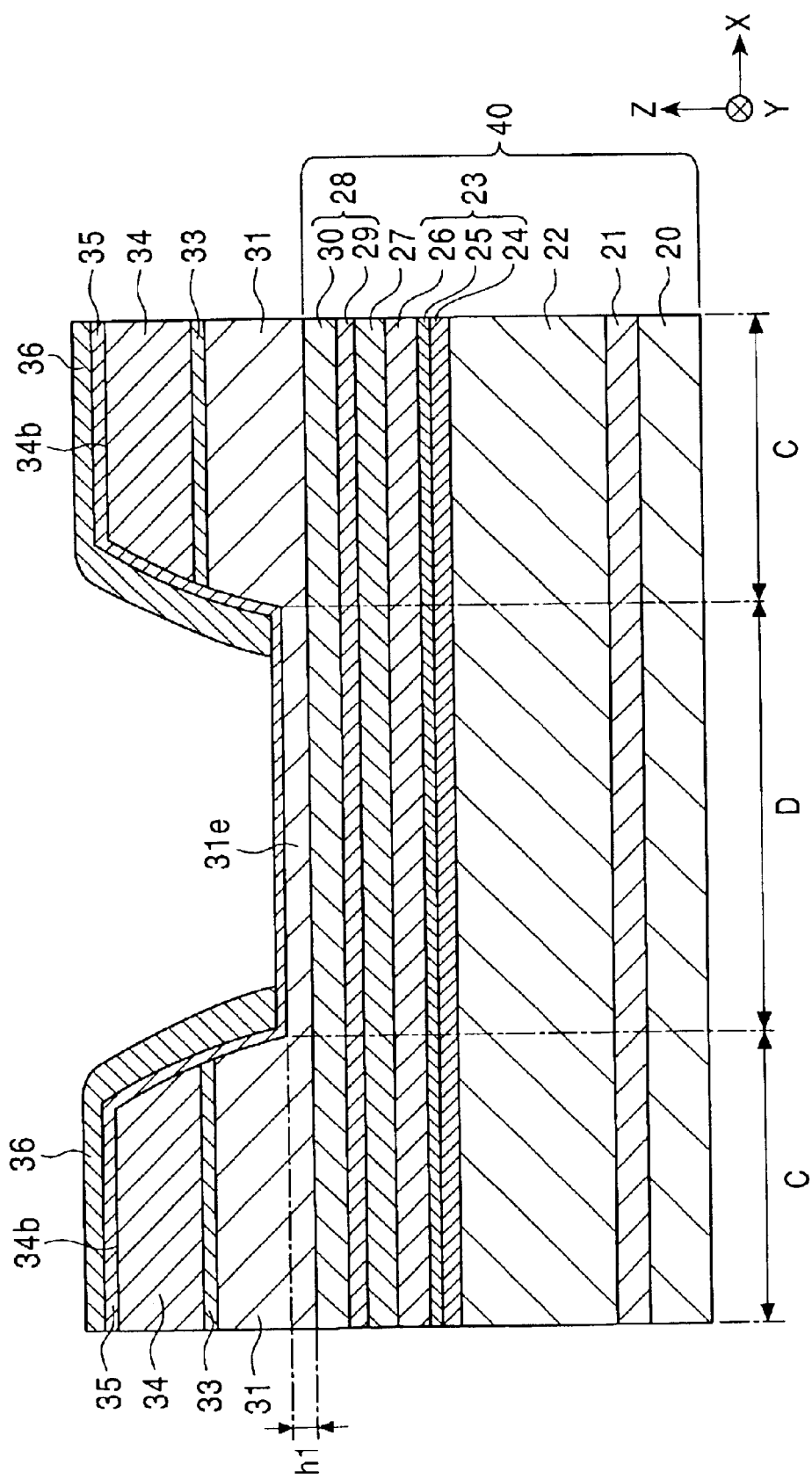
FIG. 2 is a partly cross-sectional view showing the structure of a magnetic sensor according to a second embodiment of the present invention, the sensor being viewed from an opposing face side opposing a recording medium.

Next, the area in which the second electrode layer 36 is formed will be described. In the embodiment shown in FIG. 1, the second electrode layers 36 are each formed above the internal end surface 34a of the first electrode layer 34, the internal end surface 31a of the second antiferromagnetic layer 31, and part of the upper surface of the multilayer film 40 with an additional layer provided therebetween. As shown in FIG. 2 (partly cross-sectional view showing a magnetic sensor of a second embodiment of the present invention, the sensor being viewed from an opposing face side opposing a recording medium), the second electrode layers 36 may be formed so as to extend onto the upper surfaces 34b of the first electrode layers 34; however, in this case, the following points must be taken into consideration.

In the manufacturing method described later, a solid second electrode film 36s, which is to be formed into the second electrode layers 36, is first formed on the first electrode layers 34, the internal end surfaces 31a and 34a, and the central portion D of the multilayer film 40 by sputtering, and in addition, the solid second electrode film 36s may also be formed on an insulating layer 70 widely extending in the height direction (Y direction in the figure) from the multilayer film 40.

Figure 9:
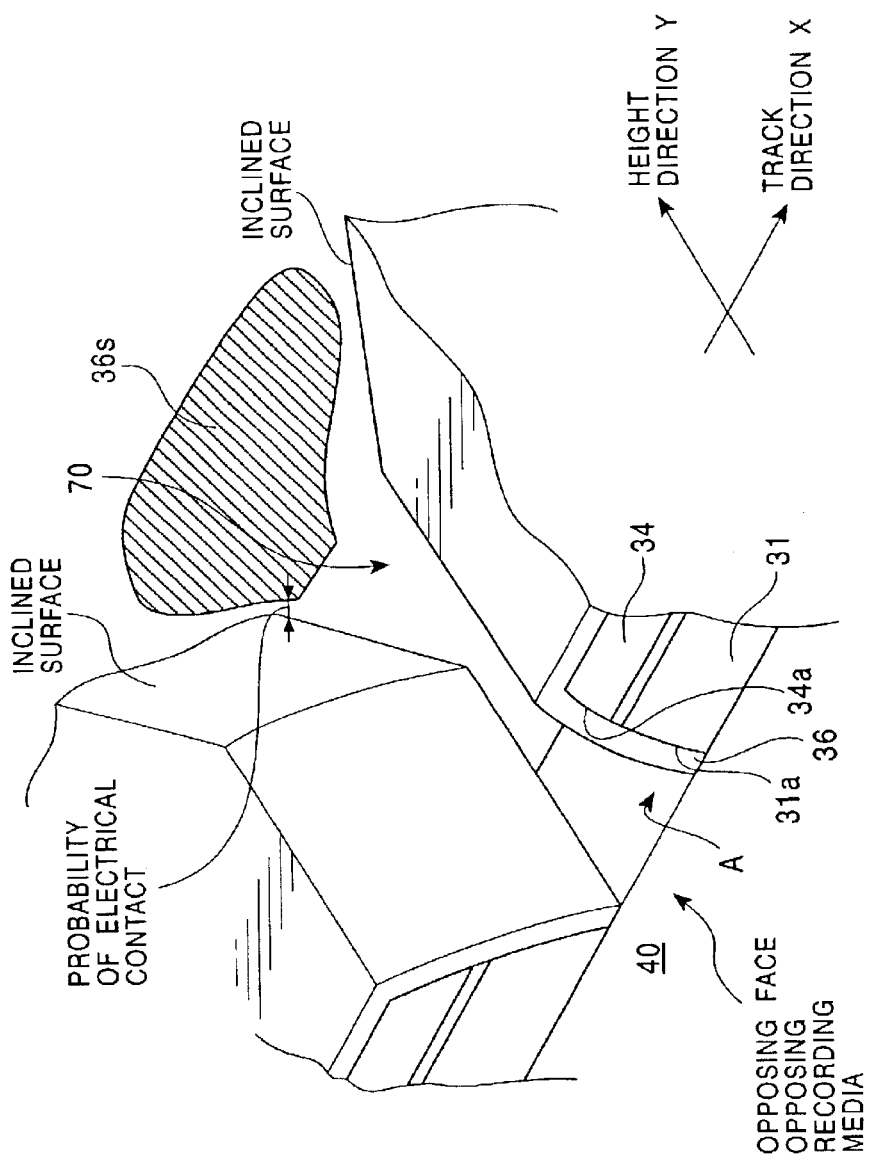
FIG. 9 is a partly schematic view showing the state of the rear side in the height direction of a magnetic sensor in one step of a manufacturing method of the present invention.

FIG. 9 is a partly schematic view showing part of the magnetic sensor shown in FIG. 2.

Since the distances in the track width direction (X direction in the figure) between the internal end surfaces 31a of the second antiferromagnetic layers 31 and between the internal end surfaces 34a of the first electrode layers 34 are gradually increased from the face opposing a recording medium to the rear side in the height direction (Y direction in the figure), the internal end surfaces 31a of the second antiferromagnetic layers 31 and the respective internal end surfaces 34a of the first electrode layers 34 form inclined or curved surfaces. In addition, from the rear end of the multilayer film 40 in the height direction, the insulating layer 70 is widely formed. As described above, the solid second electrode film 36s is also formed on this insulating layer 70. The thickness of the solid second electrode film 36s formed on the insulating layer 70 is approximately equivalent to that formed on the upper surface 34b of the first electrode layer 34. However, the thickness of the solid second electrode film 36s, formed in a very narrow region A on the multilayer film 40 at the opposing face side opposing a recording medium, is smaller than each thickness of the solid second electrode film 36s formed on the insulating layer 70 and the upper surface 34b of the first electrode layer 34. This is due to a so-called shadow effect, and as described later, the solid second electrode film 36s formed on the region A of the multilayer film 40 is finally removed by etching.

However, even when the solid second electrode film 36s formed on the region A of the multilayer film 40 is entirely removed, since the thicknesses of the solid second electrode film 36s formed on the insulating layer 70 and the upper surfaces 34b of the first electrode layers 34 are large, parts thereof still remain after the etching mentioned above is performed. Because of the solid second electrode film 36s (shown by oblique lines in the figure) remaining on the insulating layer 70, a problem may arise. When the solid second electrode film 36s which remains, for example, on the insulating layer 70 is in electrical contact with that remaining on the internal end surfaces 31a of the second antiferromagnetic layers 31, sense current may flow to the solid second electrode film 36s side remaining on the insulating layer 70, and as a result, the reproduction characteristics may not be effectively improved.

Accordingly, since the entire solid second electrode film 36s remaining on the insulating layer 70 is preferably removed, after the solid second electrode film 36s formed on the region A is totally removed, etching is further performed for removing every solid second electrode film 36s on the insulating layer 70, and as a result, the solid second electrode film 36s on the upper surfaces 34b of the first electrode layers 34 are also entirely removed as shown in FIG. 1. For example, at the stage shown in FIG. 9, when the magnetic sensor is selectively protected by a resist or the like in order to only remove the solid second electrode film 36s on the insulating layer 70, parts of the solid second electrode film 36s also remain above the upper surfaces 34b of the first electrode layers 34 as shown in FIG. 2 and are used as the second electrode layers 36.

Next, the second stop layers 35 will be described. The second stop layers 35 are formed under the second electrode layers 36 as shown in FIG. 1. The second stop layers 35 are preferably formed of at least one element selected from the group consisting of Ta, Cr, V, Nb, Mo, W, Fe, Co, Ni, Pt, and Rh.

Among essential characteristics as the second stop layer 35, the conductivity is first required, and secondary, an etching rate lower than that of the second electrode layer 36 is required. The reason the conductivity is the essential characteristic is that sense current flows from the second electrode layer 36 to the multilayer film 40 side through the second stop layer 35. Next, the reason the etching rate lower than that of the second electrode layer 36 is the essential characteristic is that in the manufacturing method described later, even when overetching is performed in a step of removing the solid second electrode film 36s formed on the central portion D of the multilayer film 40, a layer under the solid second electrode film 36s must be prevented from being damaged by the etching described above. Even when the overetching is performed, since the second stop layer 35 having a low etching rate is only exposed and may not be totally removed at all by this overetching, the layer provided thereunder is prevented from being damaged by the etching.

In the embodiment shown in FIG. 1, the second stop layer 35 is not present between internal end surfaces in the track width direction (X direction in the figure) of the second electrode layers 36; however, as shown by a dotted line, the second stop layer 35 may remain partly between the second electrode layers 36. In addition, in the embodiment in FIG. 1, the second stop layers 35 are not present on the upper surfaces 34b of the first electrode layers 34; however, the second stop layers 35 may remain on the upper surfaces 34b of the first electrode layers 34. According to the manufacturing method described later, on the upper surfaces 34b of the first electrode layers 34, mask layers 42 and the second stop layers 35 may remain in some cases.

In the case in which the second stop layer 35 is formed of a material which is not etched by reactive ion etching (RIE) or which is unlikely to be etched thereby, even when the second stop layer 35 is exposed by overetching the solid second electrode film 36s, the second stop layer 35 is not substantially influenced by this etching. Although the manufacturing method described later includes a step of removing the solid second electrode film 36s above the center portion D by reactive ion etching, for example, when the second stop layer 35 is formed of a material which is not etched by the reactive ion etching mentioned above, of course, the second stop layer 35 is not etched thereby, and hence the material described above may be used for forming the second stop layer 35.

In addition, the second stop layer 35 may have a laminate structure composed of a Cr layer and a Ta layer provided in that order from the bottom. The Cr layer easily diffuses with Au. When diffusion occurs, it is not preferable since the element resistance is increased. When the second electrode layer 36 is formed, for example, of Au, and the second stop layer 35 is formed from a Cr layer, the Ta layer mentioned above is preferably provided between the Cr layer and the second electrode layer 36 in order to prevent the diffusion described above. In addition, the second stop layer 35 may have a laminate structure composed of a Ta layer, a Cr layer, and a Ta layer in that order. When the first electrode layer 34 is formed of a material which easily diffuses with a Cr layer, by forming the second stop layer 35 having the three-layer structure described above, the diffusion of the Cr layer with the first electrode layer 34 can be suppressed.

Although the second stop layer 35 may not be formed, it is preferably formed. As described with reference to FIG. 9, the reason for this is that since the solid second electrode film 36s remaining on the insulating layer 70 must be removed by etching even after the solid second electrode film 36s on the region A was entirely removed, when the second stop layer 35 is not provided, the multilayer film 40 or the connecting layer 31e provided between the second antiferromagnetic layers 31, which is formed on the multi-layer film 40, are influenced by this overetching. However, as described with reference to FIG. 9, in order to remove only the solid second electrode film 36s remaining on the insulating layer 70 by etching, when a resist is provided to protect the magnetic sensor, the magnetic sensor will not receive any influence of the etching described above, and hence the second stop layer 35 may not be formed.

In the embodiment shown in FIG. 1, the protective layer 37 is continuously formed on the upper surfaces 34b of the first electrode layers 34, the second electrode layers 36, and the central portion D of the multilayer film 40. The protective layer 37 is formed of an oxide of Ta or the like and serves to appropriately protect the magnetic sensor shown in FIG. 1 from oxidation. For the formation of the protective layer 37, a Ta film is formed and is then oxidized. The thickness of the protective layer 37 is, for example, in the range of from approximately 20 to 50 Å.

In addition, in the embodiment shown in FIG. 1, the first stop layers 33 are provided between the second antiferromagnetic layers 31 and the first electrode layers 34. As is the second stop layer 35, the first stop layer 33 is formed of Cr, Ta, or the like. The first stop layer 33 may not be formed; however, when it is formed, the etching amount of the connecting layer 31e provided on the central portion D can be appropriately adjusted while SIMS (secondary ion mass spectrometer) measurement is performed for determining an appropriate etching depth of the connecting layer 31e provided between the second antiferromagnetic layers 31.

Figure 3:
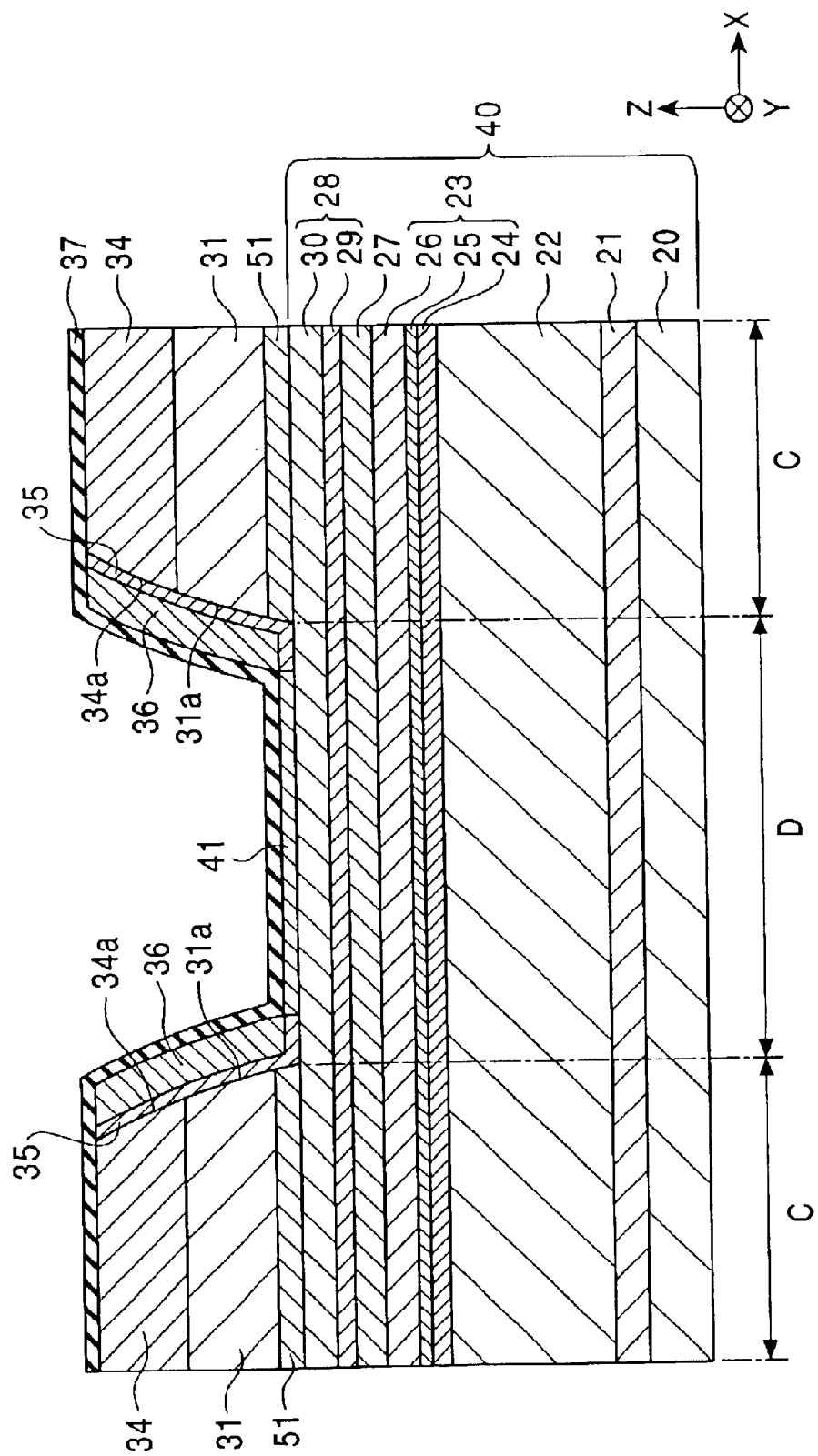
FIG. 3 is a partly cross-sectional view showing the structure of a magnetic sensor according to a third embodiment of the present invention, the sensor being viewed from an opposing face side opposing a recording medium.

In the embodiment shown in FIG. 1, the connecting layer 31e having a small thickness is formed on the central portion D; however, as shown in FIG. 3 (partly cross-sectional view of the structure of a magnetic sensor of a third embodiment according to the present invention, the sensor being viewed from an opposing face side opposing a recording medium), the connecting layer 31e may not be provided on the central portion D.

When the connecting layer 31e is provided on the central portion D as shown in FIG. 1, a film thickness h1 thereof is preferably 50 Å or less. The thickness of connecting layer 31e on the central portion 31 is controlled so that an exchange coupling magnetic field with the free magnetic layer 28 is not generated or is very weak even when annealing in a magnetic field is performed. The reason for this is that when connecting layer 31e having a large thickness is provided on the central portion D, a strong exchange coupling magnetic filed with the free magnetic layer 28 is generated, and the magnetization of the free magnetic layer 28 at the central portion D is fixed in the X direction shown in the figure, resulting in degradation of the reproduction sensitivity.

In the magnetic sensor shown in FIG. 2, as described above, the second electrode layers 36 are formed to extend onto the upper surfaces 34b of the first electrode layers 34 with the second stop layer 35 provided therebetween. In addition to the area under the second electrode layers 36, the second stop layer 35 is formed over the entire surface on the central portion D on which the second electrode layer 36 is not formed. In this case, the structures of the other layers are equivalent to those described above with reference to FIG. 1, descriptions thereof are omitted.

In the magnetic sensor shown in FIG. 3, which is different from that shown in FIG. 1, the first stop layers 33 are not present between the second antiferromagnetic layers 31 and the first electrode layers 34. In addition, in the magnetic sensor shown in FIG. 3, the connecting layer 31e is not formed on the center portion D of the multilayer film 40, and the two second antiferromagnetic layers 31 are formed only on the two side portions C.

In addition, in the magnetic sensor shown in FIG. 3, at the two side portions C, ferromagnetic layers 51 formed of a NiFe alloy of the like are each provided between the second antiferromagnetic layer 31 and the free magnetic layer 28. In this embodiment, when an exchange coupling magnetic field is generated between the ferromagnetic layer 51 and the second antiferromagnetic layer 31 so that the magnetization of the ferromagnetic layer 51 is fixed in the X direction shown in the figure, the magnetization of the free magnetic layer at each side portion C is also fixed in the X direction by interlayer coupling with the ferromagnetic layer 51.

In the magnetic sensor shown in FIG. 3, a nonmagnetic layer 41 composed of Ru or the like is formed on the central portion D of the multilayer film 40 and between the second strop layers 35. This nonmagnetic layer 41 is formed separately from the second stop layers 35 which are each formed extending from one of two ends of the nonmagnetic layer 41 to the internal end surface 31a of the second antiferromagnetic layer 31 and the internal end surface 34a of the first electrode layer 34. The nonmagnetic layer 41 is preferably formed of at least one selected from the group consisting of Ru, Re, Pd, Os, Ir, Pt, Au, and Rh.

The reason the structure in FIG. 3 is different from that described above is that a step of forming the first electrode layers 34 and the preceding steps are different from those shown in FIGS. 1 and 2. The structures of other layers or the like are equivalent to those described above with reference to FIG. 1, descriptions thereof are omitted.

Figure 4:
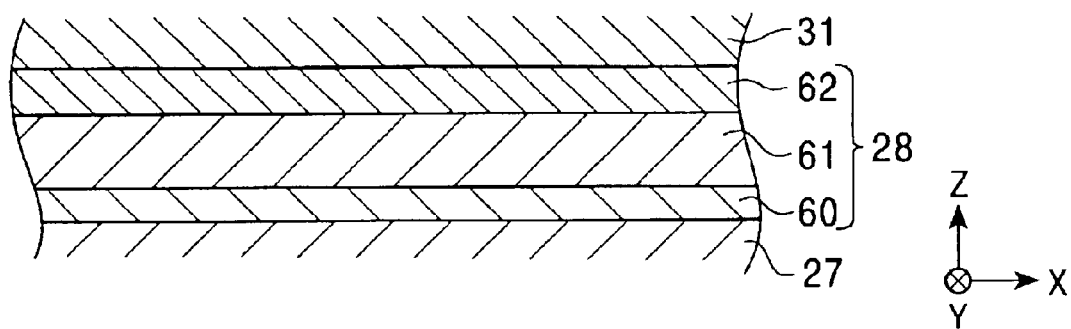
FIG. 4 is a partly, enlarged, cross-sectional view showing one embodiment of a free magnetic layer of the present invention, the embodiment being-viewed from an opposing face side opposing a recording medium.

FIG. 4 is a partly enlarged cross-sectional view primarily showing the free magnetic layer 28 viewed from an opposing face side opposing a recording medium.

The free magnetic layer 28 according to the embodiment shown in FIG. 4 has a three-layer structure. Reference numerals 60, 61, 62 indicate magnetic material layers forming the free magnetic layer 28, and the magnetic material layer 60 is a diffusion-blocking layer for inhibiting diffusion of elements with the nonmagnetic material layer 27. The magnetic material layer 60 is formed of a CoFe alloy, Co, or the like.

The magnetic material layer 62 is formed in contact with the second antiferromagnetic layer 31. The magnetic material layer 62 is preferably formed of a CoFe alloy or a CoFeCr alloy, and hence an exchange coupling magnetic field generated between the magnetic material layer 62 and the second antiferromagnetic layer 31 can be increased.

As the combination of materials forming the three-layer structure shown in FIG. 4, for example, a CoFe alloy for the magnetic material layer 60, a NiFe alloy for the magnetic material layer 61, and a CoFe alloy for the magnetic material layer 62 may be mentioned.

The free magnetic layer 28, which is formed of only magnetic materials, preferably has a thickness of approximately 30 to 40 Å. In addition, the composition of the CoFe alloy used for the free magnetic layer 28 is, for example, 90 atomic percent of Co and 10 atomic percent of Fe.

Figure 5:
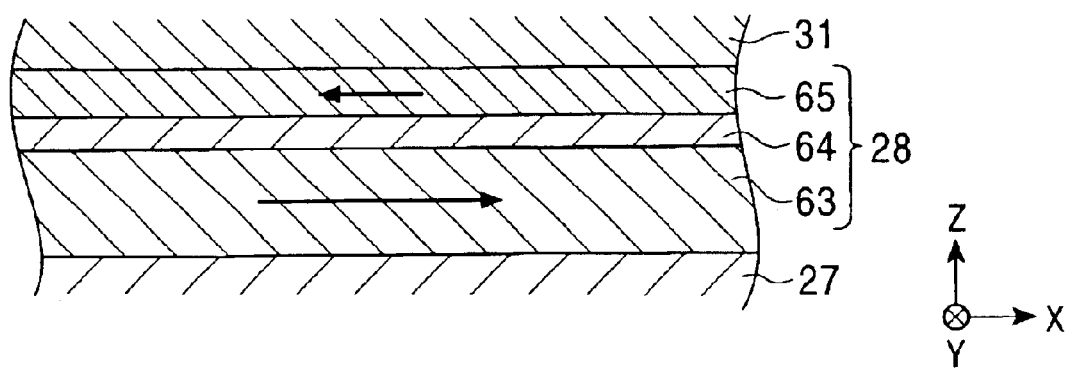
FIG. 5 is a partly, enlarged, cross-sectional view showing another embodiment of a free magnetic layer of the present invention, the embodiment being viewed from an opposing face side opposing a recording medium.

FIG. 5 is a partly enlarged cross-sectional view showing another embodiment of the free magnetic layer 28. The free magnetic layer 28 shown in FIG. 5 has a so-called artificial ferrimagnetic structure. By this structure, the effective magnetic thickness of the free magnetic layer 28 can be decreased without extremely decreasing the physical thickness thereof, and hence the sensitivity to an external magnetic field can be improved.

Reference numerals 63 and 65 indicate magnetic layers, and reference numeral 64 indicates a nonmagnetic interlayer. The magnetic layers 63 and 65 are formed of a magnetic material such as a NiFe alloy, a CoFe alloy, a CoFeNi alloy, Co, or a CoNi alloy. In particular, the magnetic layer 63 and/or the magnetic layer 65 is preferably formed of a CoFeNi alloy. As the composition, it is preferable that the content of Fe be 9 to 17 atomic percent, the content of Ni be 0.5 to 10 atomic percent, and the balance be Co.

Accordingly, a coupling magnetic field by the RKKY interaction effect acting between the magnetic layers 63 and 65 can be increased. In particular, the spin flop magnetic field (Hsp) can be increased to approximately 293 (kA/m) or more. Accordingly, the magnetizations of the magnetic layer 63 and the magnetic layer 65 are appropriately placed in an antiparallel state. In addition, when the composition is within the ranges described above, the magnetostriction of the free magnetic layer 28 can be controlled in the range of from $-3\times10^{-6}$ to $3\times10^{-6}$, and the coercive force can be decreased to 790 (A/m) or less.

In addition, improvement in soft magnetic characteristics of the free magnetic layer 28 can be appropriately achieved, and in addition, decreases of the change in resistance ($\Delta R$) and rate of change in resistance ($\Delta R/R$) caused by the diffusion of Ni with the nonmagnetic material layer 27 can appropriately be suppressed.

The nonmagnetic interlayer 64 is preferably formed of at least one selected from the group consisting of Ru, Rh, Ir, Cr, Re, and Cu.

The thicknesses of the magnetic layer 63, the nonmagnetic interlayer 64, and the magnetic layer 65 are, for example, approximately 35, 9, and 15 Å, respectively.

Figure 8:
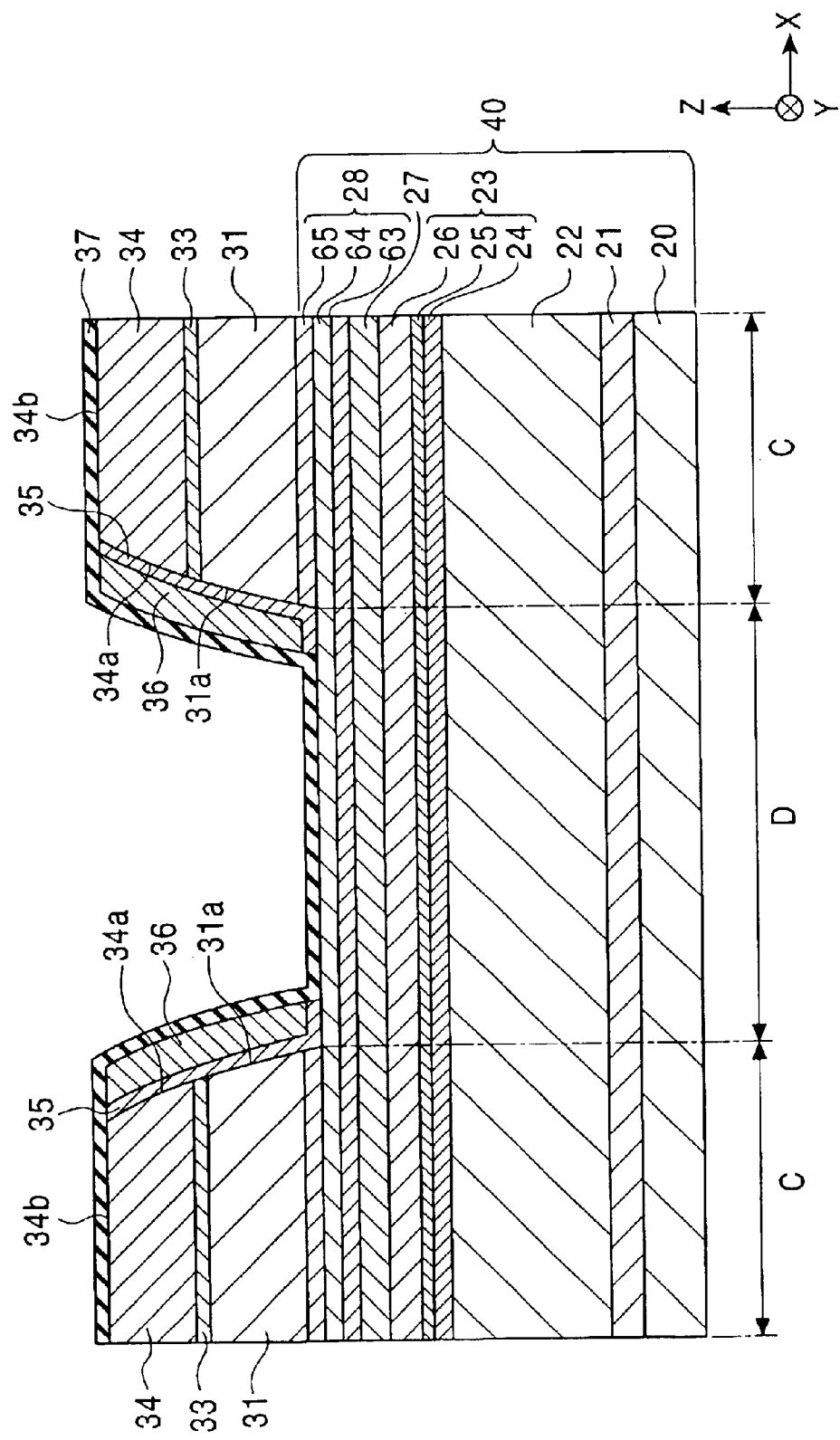
FIG. 8 is a partly cross-sectional view showing the structure of a magnetic sensor according to a fourth embodiment of the present invention, the sensor being viewed from an opposing face side opposing a recording medium.

When the free magnetic layer 28 is formed having an artificial ferrimagnetic structure, as shown in FIG. 8, the magnetic layer 65 may be totally removed at the central portion D so that the nonmagnetic interlayer 64 is exposed between the second antiferromagnetic layers 31. Accordingly, the free magnetic layer 28 at the central portion D has not an artificial ferrimagnetic structure and serves as a free magnetic layer composed of only general magnetic layers. In addition, since the free magnetic layer 28 has artificial ferrimagnetic structures at the two side portions C, unidirectional bias magnetic fields can be increased, the magnetizations of the free magnetic layer 28 at the two side portions C can be more reliably fixed in the track width direction, and hence the generation of side reading can be prevented.

In addition, between the magnetic layer 63 and the nonmagnetic material layer 27, a diffusion-blocking layer formed of a CoFe alloy or Co may be provided. Furthermore, between the magnetic layer 65 and the second antiferromagnetic layer 31, a magnetic layer formed of a CoFe alloy may be provided.

In the case described above, when the magnetic layer 63 and/or the magnetic layer 65 is formed of a CoFeNi alloy, it is preferable that the composition ratio of Fe in the CoFeNi alloy be from 7 to 15 atomic percent, the ratio of the Ni be from 5 to 15 atomic percent, and the balance be Co.

Accordingly, an exchange coupling magnetic field by the RKKY interaction effect generated between the magnetic layers 63 and 65 can be increased. In particular, the spin flop magnetic field (Hsp) can be increased to approximately 293 (kA/m). Accordingly, the magnetizations of the magnetic layer 63 and the magnetic layer 65 can be appropriately placed in an antiparallel state.

In addition, when the composition is within the ranges described above, the magnetostriction of the free magnetic layer 28 can be controlled in the range of from $-3 \times 10^{-6}$ to $3 \times 10^{-6}$, and the coercive force can be decreased to 790 (A/m) or less. Furthermore, the soft magnetic characteristics of the free magnetic layer 28 can also be improved.

Figure 6:
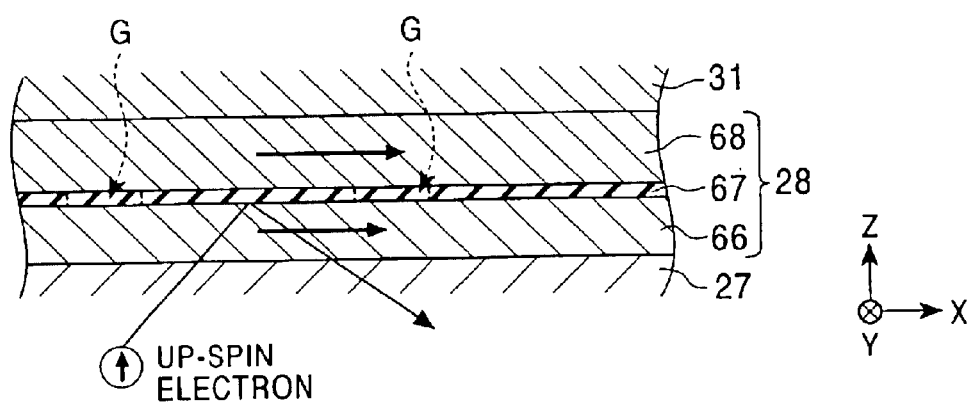
FIG. 6 is a partly, enlarged, cross-sectional view showing another embodiment of a free magnetic layer of the present invention, the embodiment being viewed from an opposing face side opposing a recording medium.

FIG. 6 is a partly enlarged cross-sectional view of another embodiment of the free magnetic layer 28 of the present invention. In the free magnetic layer 28 shown in FIG. 6, a specular film 67 is provided between the magnetic layers 66 and 68. In the specular film 67, defects (pinholes) G may be formed as shown in FIG. 6. In addition, in the embodiment shown in FIG. 6, the magnetic layers 66 and 68 provided with the specular film (mirror reflection layer) 67 therebetween are magnetized in the same direction.

The magnetic layers 66 and 68 are formed of a magnetic material, such as a NiFe alloy, a CoFe alloy, a CoFeNi alloy, Co, or a CoNi alloy.

When the specular film 67 is formed in the free magnetic layer 28, a conduction electron (such as up-spin electron) that reaches the specular film 67 is specularly reflected while maintaining the spin state (energy, quantum state, and the like). The up-spin electron thus specularly reflected changes the traveling direction thereof and can pass through the free magnetic layer.

Accordingly, in the present invention, by providing the specular film 67, a mean free path λ+ of the up-spin electron can be increased as compared to that in the past, the difference between the mean free path λ+ of the up-spin conduction electron and a mean free path λ− of a down-spin conduction electron can be increased thereby, and as a result, the reproduction output can be improved in addition to the improvement of the rate of change in resistance (ΔR/R).

The formation of the specular film 67 is performed, for example, by forming the magnetic layer 66 through the steps described above followed by oxidation thereof. This oxidized layer may be used as the specular film 67. Subsequently, the magnetic layer 68 is formed on the specular film 67.

As a material for the specular film 67, for example, there may be mentioned an oxide, such as Fe—O, Ni—O, Co—O, Co—Fe—O, Co—Fe—Ni—O, Al—O, Al—Q—O (Q is at least one selected from the group consisting of B, Si, N, Ti, V, Cr, Mn, Fe, Co, and Ni), or R—O (R is at least one selected from the group consisting of Cu, Ti, V, Cr, Zr, Nb, Mo, Hf, Ta, and W); a nitride such as Al—N, Al—Q—N (Q is at least one selected from the group consisting of B, Si, O, Ti, V, Cr, Mn, Fe, Co, and Ni), or R—N (R is at least one selected from the group consisting of Ti, V, Cr, Zr, Nb, Mo, Hf, Ta, and W); or a half-metal whistler alloy.

Figure 7:
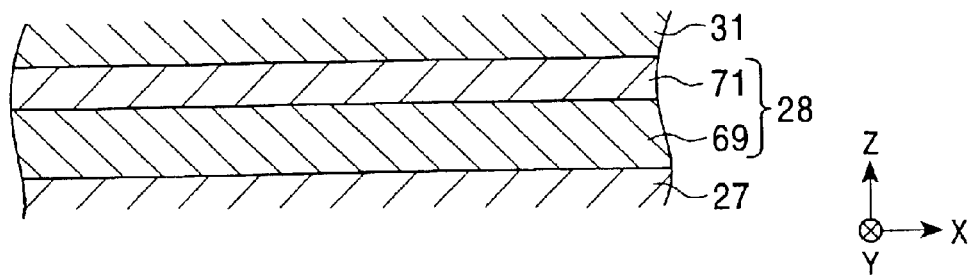
FIG. 7 is a partly, enlarged, cross-sectional view showing another embodiment of a free magnetic layer of the present invention, the embodiment being viewed from an opposing face side opposing a recording medium.

FIG. 7 is a partly enlarged cross-sectional view of another embodiment of the free magnetic layer 28 of the present invention.

In the free magnetic layer 28 shown in FIG. 7, a back layer 71 is formed between the magnetic layer 69 and the second antiferromagnetic layer 31. The back layer 71 is formed, for example, of Cu, Au, Cr, or Ru. The magnetic layer 69 is formed of a magnetic material such as a NiFe alloy, a CoFe alloy, a CoFeNi alloy, Co, or CoNi alloy.

By providing the back layer 71, the mean free path of an up-spin conduction electron, which contributes to the magnetoresistive effect, is increased, and a high rate of change in resistance can be obtained in a spin-valve type magnetic sensor by a so-called spin filter effect, thereby achieving higher recording density. In addition, since the back layer 71 serves to allow exchange coupling to pass therethrough, although being slightly decreased, the exchange coupling magnetic field between the second antiferromagnetic layer 31 and the magnetic layer 69 can be maintained at a satisfactory level.

FIGS. 10 to 16 are views showing steps of a method for manufacturing the magnetic sensor shown in FIG. 1. FIGS. 10 to 16 are partly cross-sectional views of the sensor viewed from an opposing face side opposing a recording medium.

Figure 10:
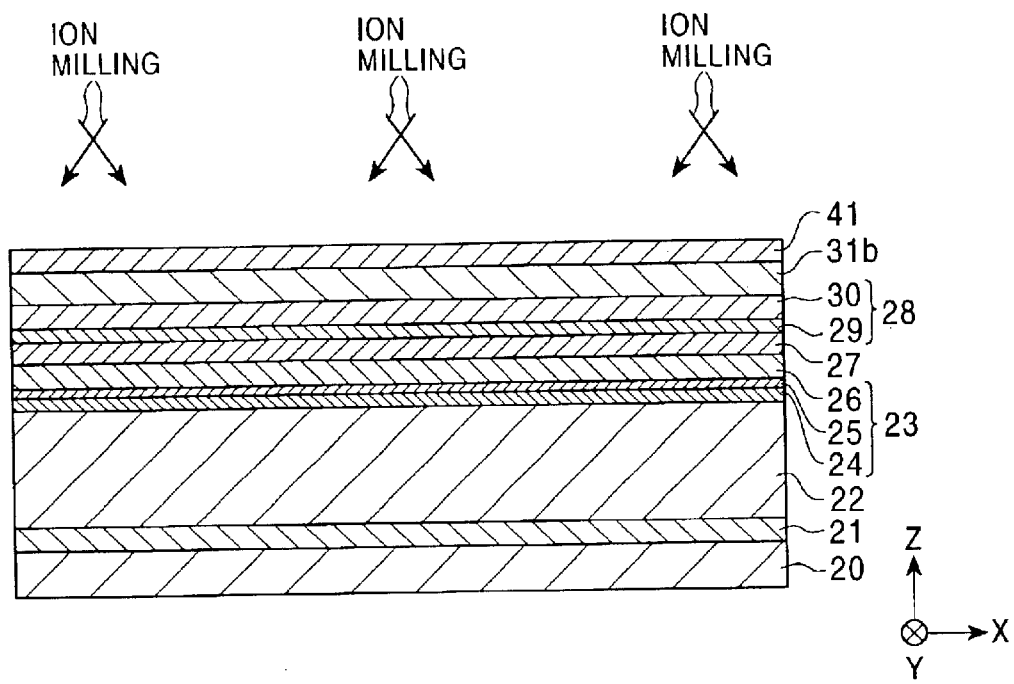
FIG. 10 is a schematic view showing a step of manufacturing the magnetic sensor shown in FIG. 1.

In the step shown in FIG. 10, on the substrate 20, the seed layer 21, the first antiferromagnetic layer 22, the fixed magnetic layer 23, the nonmagnetic material layer 27, the free magnetic layer 28, a solid second antiferromagnetic film 31b, and the nonmagnetic layer 41 are sequentially formed. Film formation is performed by sputtering or vapor deposition. The fixed magnetic layer 23 shown in FIG. 10 has an artificial ferrimagnetic structure composed of the magnetic layers 24 and 26, which are formed of a CoFe alloy or the like, and the nonmagnetic interlayer 25 which is formed of Ru or the like and is provided therebetween. The free magnetic layer 28 has a laminate structure composed of the diffusion-blocking layer 29 formed of a CoFe alloy or the like and the magnetic material layer 30 formed of a NiFe alloy or the like.

In the present invention, the first antiferromagnetic layer 22 and the solid second antiferromagnetic film 31b are preferably formed of a PtMn alloy, an X—Mn alloy (X is at least one element selected from the group consisting of Pd, Ir, Rh, Ru, Os, Ni, and Fe), or a Pt—Mn—X' alloy (X' is at least one element selected from the group consisting of Pd, Ir, Rh, Ru, Au, Ag, Os, Cr, Ni, Ar, Ne, Xe, and Kr).

In addition, in the alloys represented by PtMn and X—Mn, the Pt or X is preferably in the range of from 37 to 63 atomic percent. In the alloys represented by PtMn and X—Mn, the Pt or X is more preferably in the range of from 47 to 57 atomic percent.

In the alloy represented by Pt—Mn—X', the X'+Pt is preferably in the range of from 37 to 63 atomic percent. In the alloy represented by Pt—Mn—X' alloy, the X'+Pt is more preferably in the range of from 47 to 57 atomic percent. Furthermore, in the alloy represented by Pt—Mn—X', the X' is preferably in the range of from 0.2 to 10 atomic percent. However, when the X' is at least one selected from the group consisting of Pd, Ir, Rh, Ru, Os, Ni, and Fe, the X' is more preferably in the range of from 0.2 to 40 atomic percent.

In the present invention, the thickness of the first antiferromagnetic layer 22 is preferably set in the range of from 80 to 300 Å. By forming the first antiferromagnetic layer 22 having a large thickness as described above, a strong exchange coupling magnetic field can be generated between the first antiferromagnetic layer 22 and the fixed magnetic layer 23 by annealing in a magnetic field. In particular, an exchange coupling magnetic field of 48 kA/m or more such as more than 64 kA/m can be generated.

The thickness of the solid second antiferromagnetic film 31b is preferably in the range of from 20 to 50 Å, and more preferably in the range of from 30 to 40 Å.

When the thickness of the solid second antiferromagnetic film 31b decreases to a relatively small thickness of 50 Å or less as described above, the film has non-antiferromagnetic characteristics. Accordingly, even when the following first annealing in a magnetic field is performed, the solid second antiferromagnetic film 31b is unlikely to be transformed to a film with a regular lattice, the exchange coupling magnetic field between the solid second antiferromagnetic film 31b and the free magnetic layer 28 is not generated or is very weak, and as a result, in a manner different from that of the fixed magnetic layer 23, the magnetization of the free magnetic layer 28 is not tightly fixed.

The reason the thickness of the solid second antiferromagnetic film 31b is set to 20 Å or more and preferably set to 30 Å or more is that when the thickness thereof is smaller than that as described above, although a solid second antiferromagnetic film 31c is formed on the solid second antiferromagnetic film 31b in a subsequent step, a solid second antiferromagnetic film 31 formed of the solid second antiferromagnetic films 31b and 31c is unlikely to have antiferromagnetic characteristics, and as a result, an appropriately strong exchange coupling magnetic field is not generated between the solid second antiferromagnetic film 31 and the free magnetic layer 28.

In addition, as in the step shown in FIG. 10, when the nonmagnetic layer 41 is formed on the solid second antiferromagnetic film 31b, even when the laminate shown in FIG. 10 is exposed to the air, the solid second antiferromagnetic film 31b is appropriately prevented from being oxidized.

The nonmagnetic layer 41 is preferably a dense layer unlikely to be oxidized although being exposed to the air. In addition, even when elements forming the nonmagnetic layer 41 intrude into the solid second antiferromagnetic film 31b by thermal diffusion or the like, the elements preferably have properties that will not degrade the properties thereof as the antiferromagnetic film.

In the present invention, the nonmagnetic layer 41 is preferably formed of at least one noble metal selected from the group consisting of Ru, Re, Pd, Os, Ir, Pt, Au, and Rh.

The nonmagnetic layer 41 formed of a noble metal such as Ru is a dense layer unlikely to be oxidized even when being exposed to the air. Hence, even when the thickness of the nonmagnetic layer 41 is decreased, the solid second antiferromagnetic film 31b is appropriately prevented from being oxidized when exposed to the air.

In the present invention, the nonmagnetic layer 41 preferably has a thickness of 3 to 10 Å. Even when the nonmagnetic layer 41 has a small thickness as described above, the solid second antiferromagnetic film 31b can be appropriately prevented from being oxidized when exposed to the air.

In the present invention, since the nonmagnetic layer 41 is formed from a noble metal such as Ru and is formed to have a small thickness of approximately 3 to 10 Å, at the stage of excavating the nonmagnetic layer 41 by ion milling, the ion milling can be performed with low energy, and ion milling control can be improved as compared to that in the past.

As shown in FIG. 10, after the individual layers including the nonmagnetic layer 41 are formed on the substrate 20, the first annealing in a magnetic field is performed. While a first magnetic field (Y direction in the figure) is applied in the direction perpendicular to the track width Tw (X direction in the figure), heat treatment at a first heat treatment temperature is performed so that the exchange coupling magnetic field is generated between the first antiferromagnetic layer 22 and the magnetic layer 24 forming the fixed magnetic layer 23, and as a result, the magnetization of the magnetic layer 24 is fixed in the Y direction in the figure. The magnetization of the other magnetic layer 26 is fixed in the direction opposite to the Y direction shown in the figure by exchange coupling due to the RKKY interaction effect acting between the magnetic layer 26 and the magnetic layer 24. In this case, for example, the first heat treatment temperature is set to 270° C., and the intensity of the magnetic field is set to 800 kA/m.

In addition, as described above, by this first annealing in a magnetic field, the exchange coupling magnetic field is not generated between solid second antiferromagnetic film 31b and the magnetic material layer 30 forming the free magnetic layer 28 or may be very weak even thought being generated. The reason for this is that since having a small film thickness of 50 Å or less, the solid second antiferromagnetic film 31b does not have antiferromagnetic characteristics.

It has been construed that when the first annealing in a magnetic field is performed, the noble metal such as Ru forming the nonmagnetic layer 41 diffuses inside the solid second antiferromagnetic film 31b. Accordingly, the constituent elements of the solid second antiferromagnetic film 31b in the vicinity of the surface after the annealing are primarily the noble metal and elements forming the solid second antiferromagnetic film. It has also been construed that the noble metal that diffused inside the solid second antiferromagnetic film 31b has a higher concentration at the front surface side thereof than that at the rear surface side, and the composition ratio of the noble metal thus diffused gradually decreases from the front surface side of the solid second antiferromagnetic film 31b to the rear surface side thereof. The change in composition described above can be measured by a SIMS analyzer or the like.

The nonmagnetic layer 41 is then removed by ion milling. The reason the nonmagnetic layer 41 is removed in this step is that when the thickness of the nonmagnetic layer 41 is not decreased as small as possible, an antiferromagnetic interaction effect cannot be generated between the solid second antiferromagnetic film 31b and the solid second antiferromagnetic film 31c further provided thereon in the following step.

In the present invention, the entire nonmagnetic layer 41 may be removed by this ion milling step; however, when having a thickness of 3 Å or less, the nonmagnetic layer 41 may remain. When the thickness of the nonmagnetic layer 41 is decreased to the level as described above, the solid second antiferromagnetic film 31, the thickness of which is increased by providing the additional layer in the following step, can be used as an antiferromagnetic material.

In the ion milling step shown in FIG. 10, low-energy ion milling can be used. The reason for this is that the nonmagnetic layer 41 has a very small thickness such as approximately 3 to 10 Å. In addition, in the present invention, even when the nonmagnetic layer 41 formed of Ru or the like has a very small thickness such as approximately 3 to 10 Å, the solid second antiferromagnetic film 31b formed thereunder can be sufficiently prevented from being oxidized, and the amount of the nonmagnetic layer 41 which is removed can be easily controlled by the low-energy ion milling.

Figure 11:
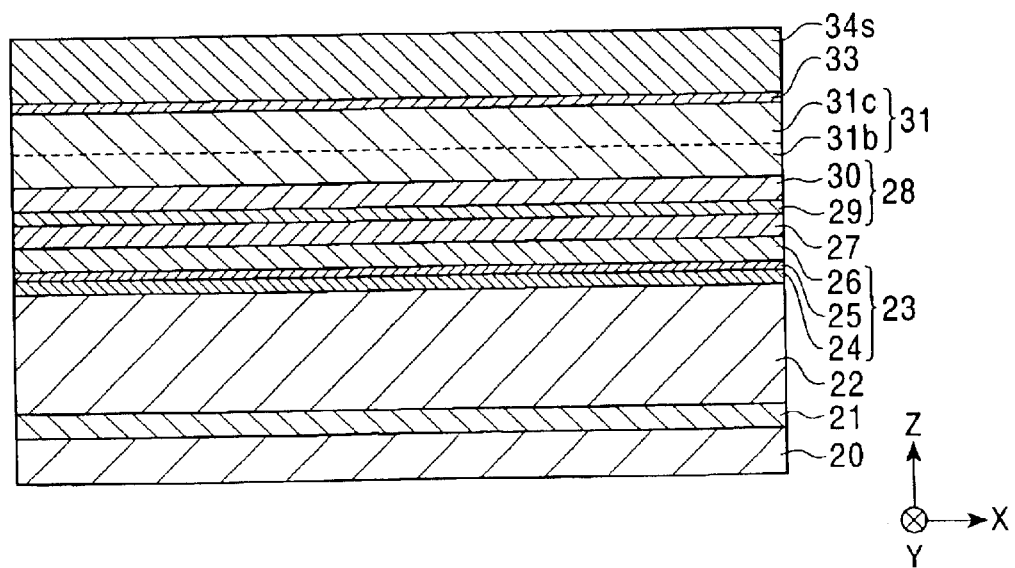
FIG. 11 is a schematic view showing a step following the step in FIG. 10.

The step shown in FIG. 11 is then performed. In the step shown in FIG. 11, on the solid second antiferromagnetic film 31b having a small thickness (or on the nonmagnetic layer 41 when a part thereof remains), the solid second antiferromagnetic film 31c is additionally provided thereon. These two solid second antiferromagnetic films 31b and 31c form the solid second antiferromagnetic film 31 having a large thickness. In this step, the solid second antiferromagnetic film 31 is formed to have a thickness of 80 to 300 Å.

Next, a solid first stop film 33, which is to be formed into the first stop layers 33, is formed on the solid second antiferromagnetic film 31. The solid first stop film 33 is preferably formed of at least one element selected from the group consisting of Cr, Ta, V, Nb, Mo, W, Fe, Co, Ni, Pt, and Rh. Alternatively, when the solid first stop film 33 is formed of a Cr layer, since diffusion may occur in some cases between the element forming the first electrode layer 34 and the solid first stop film 33, in order to prevent the diffusion described above, the solid first stop film 33 may be formed of a Cr layer and a Ta layer provided in that order from the bottom. In addition, the solid first stop film 33 preferably has a thickness of 30 to 100 Å.

Next, a solid first electrode film 34s, which is to be formed into the first electrode layers 34, is formed on the solid first stop film 33. The solid first electrode film 34s may be formed of Au or the like and is preferably formed of a material having ductility lower than that for the solid second electrode film 36s which is formed in a subsequent step. Accordingly, the sold first electrode film 34s is preferably formed of at least one of Cr, Rh, Ru, Ta, and W, or an alloy of Au containing at least one of Pd and Cr. In addition, the solid first electrode film 34s preferably has a thickness of 400 to 1,000 Å.

Figure 12:
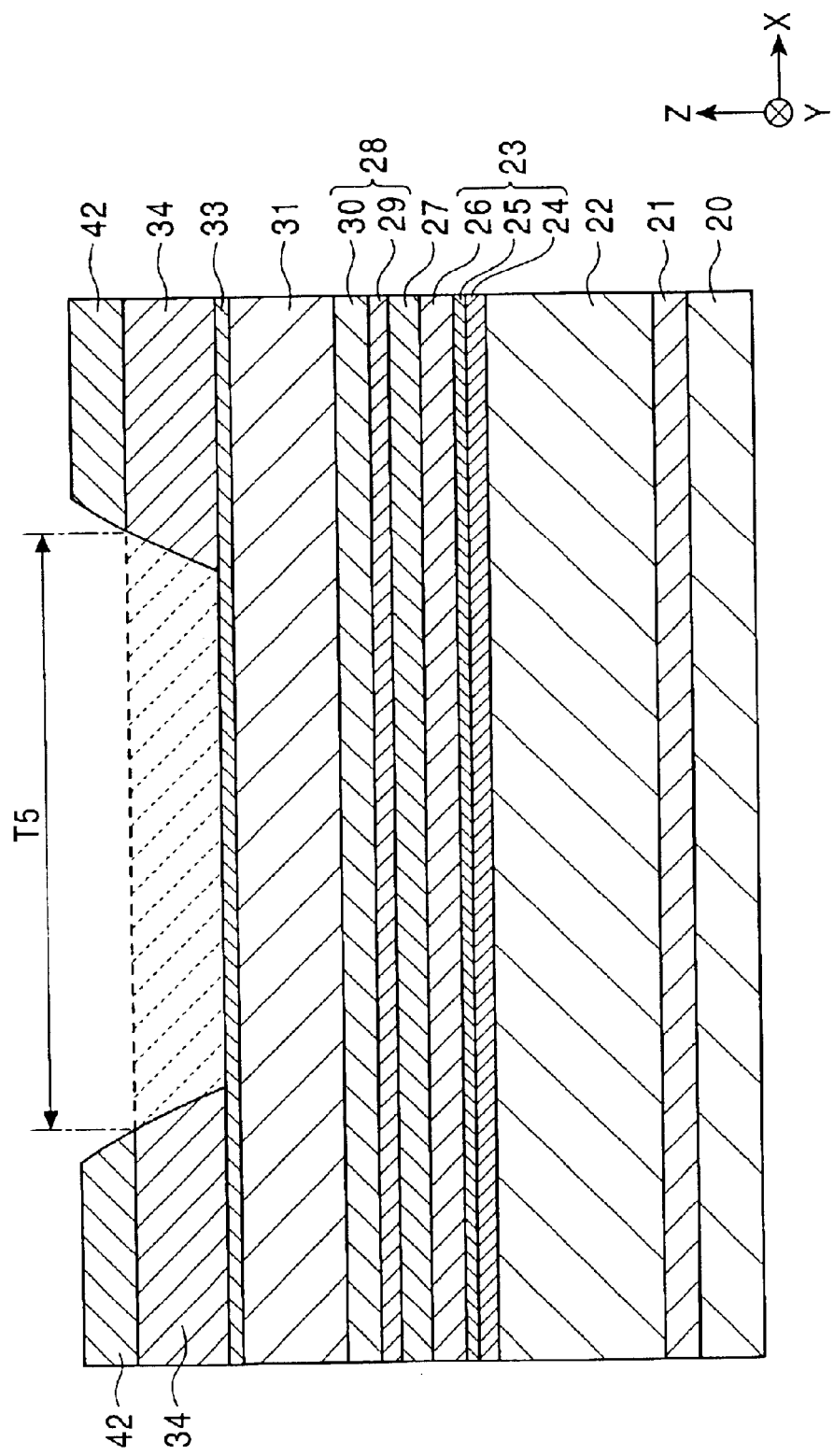
FIG. 12 is a schematic view showing a step following the step in FIG. 11.

In the step shown in FIG. 12, on the solid first electrode film 34s, the mask layers 42 disposed with a predetermined space T5 therebetween in the track width direction (X direction in the figure) are formed. The mask layers 42 may be formed of a resist material or may also be formed of a metal material. When the metal material is used, it becomes possible to make the mask layers 42 remain on the first electrode layers 34 in subsequent steps. In the step shown in FIG. 12, the mask layers 42 are formed of a metal material. For example, the mask layers 42 are formed of Cr. In the following step, parts of the solid first electrode film 34s, the solid first stop film 33, and the solid second antiferromagnetic film 31, which are not covered with the mask layers 42, are etched, and the mask layer 42 must remain until at least this etching is complete. Accordingly, when the mask layers 42 are formed, the thickness and the material thereof must be carefully determined in consideration of various conditions. For example, when the mask layers 42 are formed of Cr, and when the solid first stop film 33 is also formed of Cr, the thickness of the mask layer 42 must be larger than that of the solid first stop film 33; otherwise, when the solid first stop film 33 is removed by etching, the entire mask layers 42 on the solid first electrode film 34s are also removed. In addition, the mask layers 42 are preferably formed of a material having an etching rate lower than that of the solid first electrode film 34s and that of the solid second antiferromagnetic film 31 or is preferably formed of a material which is not etched by etchant gases used for etching the solid first electrode film 34s and the solid second antiferromagnetic film 31.

When the mask layers 42 are formed of a metal material, the film thickness thereof is preferably in the range of from approximately 100 to 500 Å.

Subsequently, the part of the solid first electrode film 34s (indicated by dotted lines shown in FIG. 12) is removed by etching. In this etching, reactive ion etching (RIE) is preferably used. As an etchant gas, for example, a mixture of $CF_4$ and $C_3F_8$, Ar and $CF_4$, or Ar and $C_3F_8$ may be used.

When the part of the solid first electrode film 34s indicated by the dotted lines is removed, the surface of the solid first stop film 33 is exposed.

Figure 13:
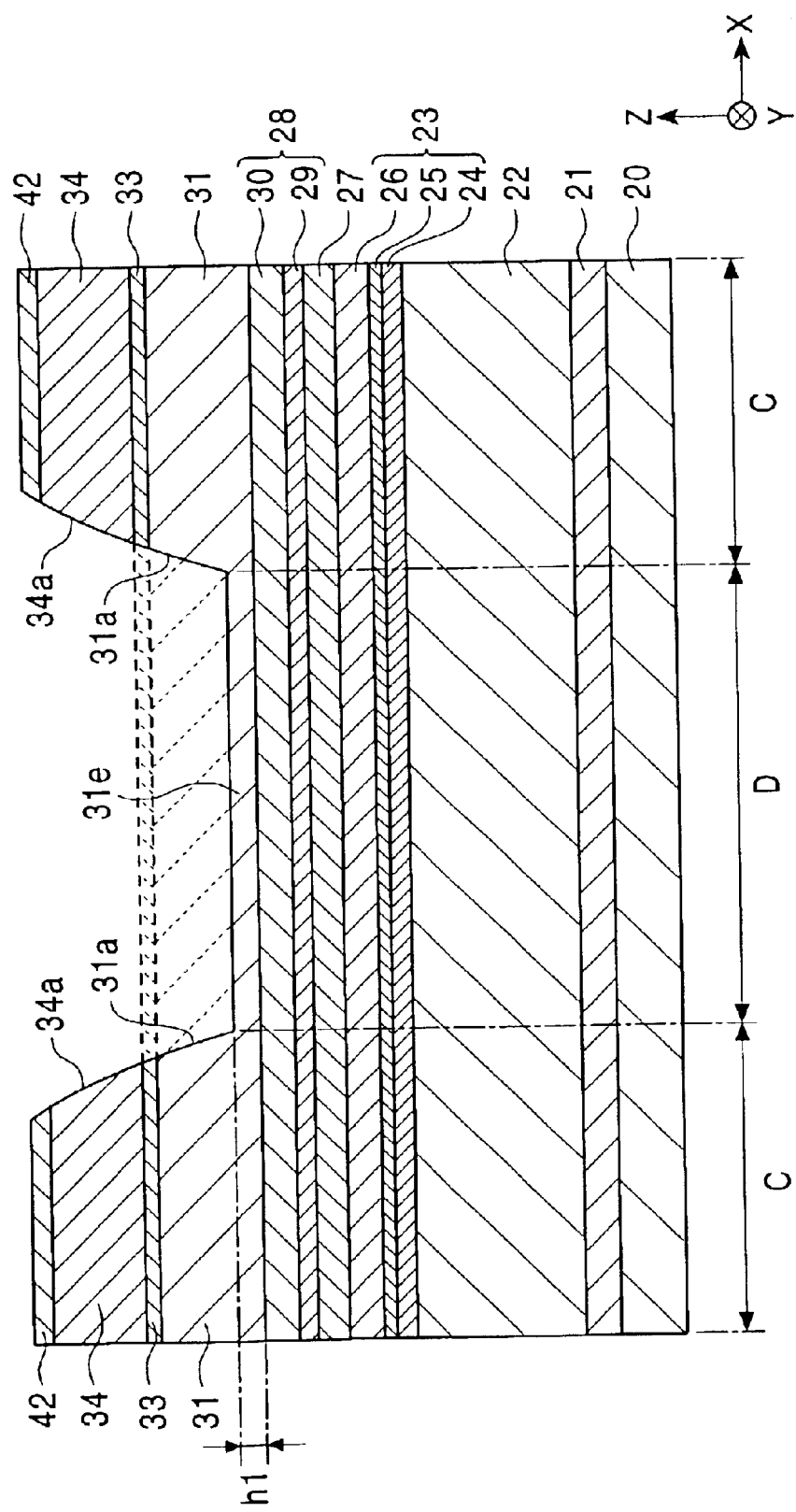
FIG. 13 is a schematic view showing a step following the step in FIG. 12.

In the step shown in FIG. 13, the solid first stop film 33 exposed between the mask layers 42 is removed by ion beam etching (IBE) (dotted lines indicate the removed solid first stop film 33), and the solid second antiferromagnetic film 31 formed thereunder is partly removed by ion beam etching (dotted lines indicate the removed solid second antiferromagnetic film). As shown in FIG. 13, the connecting layer 31e having a thickness h1 is formed on the central portion D, and the thickness h1 is preferably 50 Å or less, and more preferably 40 Å or less. The reason for this is that when the thickness h1 of the connecting layer 31e is large, an exchange coupling magnetic field is also generated with the free magnetic layer 28 at this position, and as a result, magnetization control of the free magnetic layer 28 cannot be appropriately performed. The amount of the solid second antiferromagnetic film 31 removed by etching may be controlled using a SIMS analyzer. In addition, the entire connecting layer 31e at the central portion D may be removed so that the surface of the free magnetic layer 28 is exposed. However, since it is difficult to stop etching at the same time when the entire connecting layer 31 is removed, in the case described above, the free magnetic layer 28 is influenced by this etching, and hence the connecting layer 31e having a small thickness of 50 Å or less is preferably allowed to remain at the central portion D as shown in FIG. 13.

In addition, when the solid first electrode film 34s, the solid first stop film 33, and the solid second antiferromagnetic film 31, exposed between the mask layers 42, are removed by etching, continuous inclined or curved surfaces can be formed from the internal end surfaces 34a of the first electrode layers 34 and the internal end surfaces 31a of the second antiferromagnetic layers 31. In addition, as shown in FIG. 13, the mask layers 42 may be allowed to remain slightly on the first electrode layers 34.

Figure 14:
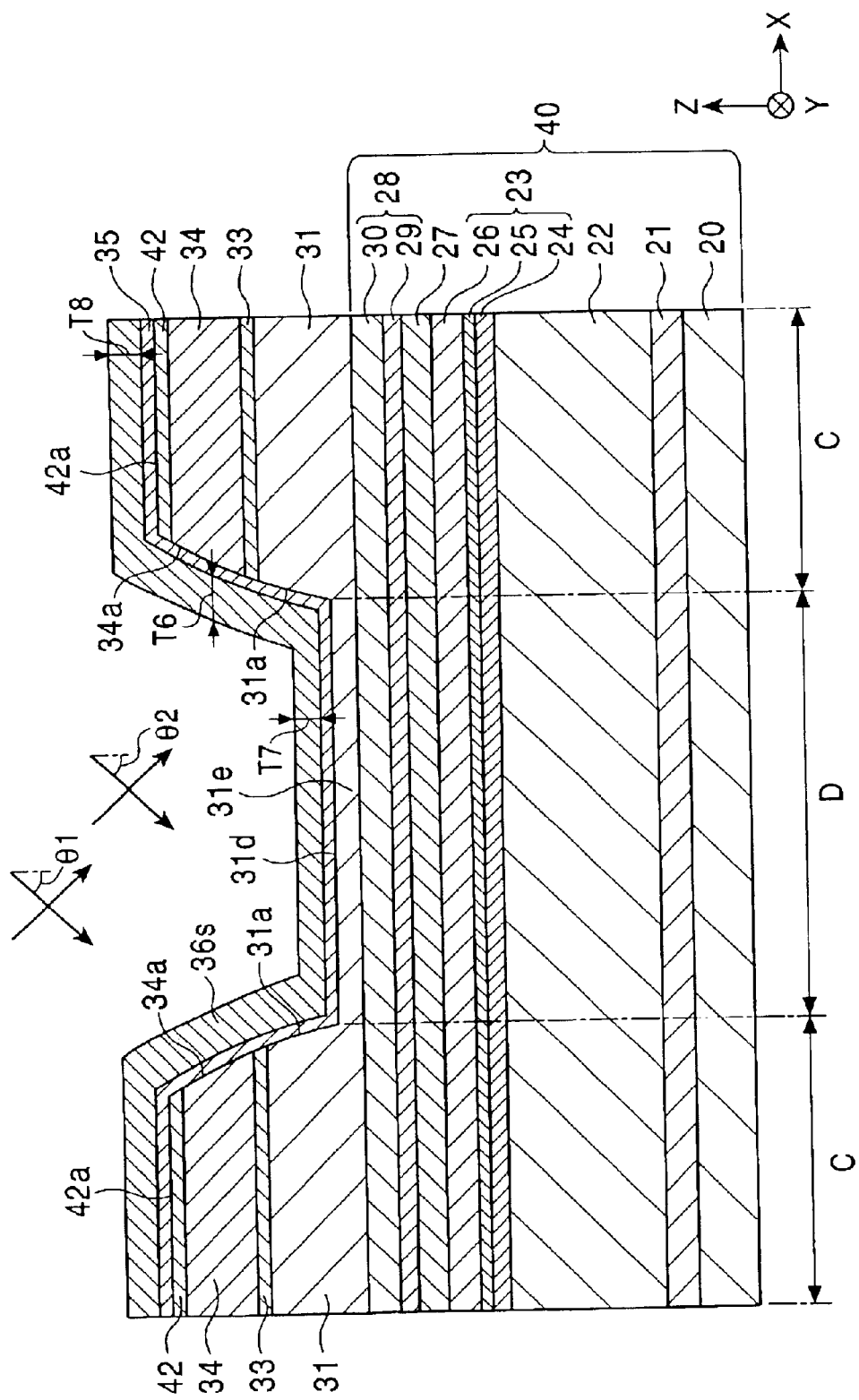
FIG. 14 is a schematic view showing a step following the step in FIG. 13.

Next, the step shown in FIG. 14 is performed. In the step shown in FIG. 14, on the upper surfaces 42a of the mask layers 42, the internal end surfaces 34a of the first electrode layers 34, the internal end surfaces 31a of the second antiferromagnetic layers 31, and the upper surface 31d of the connecting layer 31e at the central portion D, a solid second stop film 35, which is to be formed into the second stop layers 35, is formed by sputtering. As sputtering, for example, ion beam sputtering, long-throw sputtering, or collimation sputtering may be used. For example, in this step, ion beam sputtering is used. In this step, a sputtering angle (inclination from the direction (Z direction in the figure) perpendicular to the substrate 20) is represented by θ1. In FIG. 14, the sputtering angle θ1 is approximately 45° with respect to the substrate 20; however, the sputtering angle θ1 may be set more perpendicular to the substrate 20. When the sputtering angle θ1 is increased, that is, sputtering is performed in a more inclined direction, the solid second stop film 35 having a large thickness is formed on the internal end surfaces 34a of the first electrode layers 34 and the internal end surfaces 31a of the second antiferromagnetic layers 31, and on the other hand, on the upper surfaces 42a of the mask layers 42 and the upper surface 31d of the connecting layer 31e, the solid second stop film 35 having a small thickness is formed. In particular, the thickness of the solid second stop film 35 formed on the upper surface 31d of the connecting layer 31e is smaller than that formed on each of the upper surfaces 42a of the mask layers 42. This is due to the shadow effect.

However, the solid second stop film 35 having a predetermined thickness is preferably formed on the upper surface 31d of the connecting layer 31, and the reason for this is that the solid second stop film 35 on this position must appropriately serve as a stop layer in a subsequent step. Accordingly, the sputtering angle θ1 is preferably not so large and may be perpendicular (Z direction in the figure) to the substrate 20.

In the step described above, the solid second stop film 35 is preferably formed of Cr or at least one element selected from the group consisting of Ta, V, Nb, Mo, W, Fe, Co, Ni, Pt, and Rh. Conductivity of the solid second stop film 35 is preferably taken into account in selecting the material used. Since part of the solid second stop film 35 remains under the second electrode layer 36, and sense current flows from the second electrode layer 36 to the multilayer film 40, when the solid second stop film 35 has electrical insulating properties, the flow of sense current is inhibited.

Next, the solid second stop film 35 is preferably formed of a material having a lower etching rate than that of the solid second electrode film 36s. Alternatively, the solid second stop film 35 is preferably formed of a material which is not etched with etchant gases used for etching the solid second electrode film 36s. When the solid second electrode film 36s is formed, for example, of Au, an Ar gas or a mixture of an Ar gas and $C_3F_8$ is used as an etchant therefor, and when the solid second stop film 35 is formed of Cr or the like, the etching rate thereof by an Ar gas or a mixture of an Ar gas and $C_3F_8$ can be decreased as compared to that of the solid second electrode film 36s.

In the step shown in FIG. 14, the solid second electrode film 36s is formed on the solid second stop film 35 by sputtering. As sputtering, for example, ion beam sputtering, long-throw sputtering, or collimation sputtering may be used. For example, in this step, ion beam sputtering is used. In this step, a sputtering angle (inclination from the direction (Z direction in the figure) perpendicular to the substrate 20) is represented by θ2. The sputtering angle θ2 is in the range of from approximately 50 to 70°. That is, the sputtering angle θ2 is set larger so that sputtering is performed in a more inclined direction for forming the solid second electrode film 36s.

When the sputtering angle θ2 is set larger as described above, a film thickness T6 of the solid second electrode film 36s in the track width direction (X direction in the figure), which is formed on the internal end surfaces 34a of the first electrode layers 34 and the internal end surfaces 31a of the second antiferromagnetic layers 31 with the solid second stop film 35 provided therebetween, is larger than a film thickness T7 of the solid second electrode film 36s formed on the upper surface 31d of the connecting layer 31e with the solid second stop film 35 provided therebetween and a film thickness T8 of the solid second electrode film 36s formed on the upper surface of the first electrode layer 34 with the mask layer 42 and the solid second stop film 35 provided therebetween.

As described above, when the film thickness of the solid second electrode film 36s is not adjusted, by ion milling or reactive ion etching (RIE), the solid second electrode film 36s formed on the internal end surfaces 34a and 31a of the first electrode layers 34 and the second antiferromagnetic layers 31 is entirely removed. Even when the solid second electrode is allowed to remain, the thickness of the solid second electrode film 36s becomes very small, and as a result, the electrode layers having an appropriate overlap structure cannot be formed.

The film thickness T7 of the solid second electrode film 36s formed on the upper surface 31d of the connecting layer 31e at the central portion D is small as compared to the film thickness T8 of that above the first electrode layer 34. The reason for this is that since the tall first electrode layers 34 are present at the two sides in the track width direction of the upper surface 31d of the connecting layer 31e, shadows are likely to be formed thereon by the presence of the first electrode layers 34 described above when sputtering is performed. This is a so-called shadow effect.

In this step, the solid second electrode film 36s is easily formed so that the thicknesses T6 on the left side shown in FIG. 14 and that on the right side are equivalent to each other. That is, in the past, when the electrode layers are formed, mask alignment must be performed twice, and hence alignment deviation has been liable to occur when mask alignment is performed for forming the electrodes. However, according to the present invention, when the solid second electrode film 36s is formed, mask alignment performed in the past is not necessary. Hence, in the step shown in FIG. 14 according to the present invention, on the internal end surfaces 34a of the first electrode layers 34 and the internal end surfaces 31a of the second antiferromagnetic layers 31, the solid second electrode film 36s is easily formed so that the thicknesses T6 shown in the figure on the left side and that on the right side are equivalent to each other.

Figure 15:
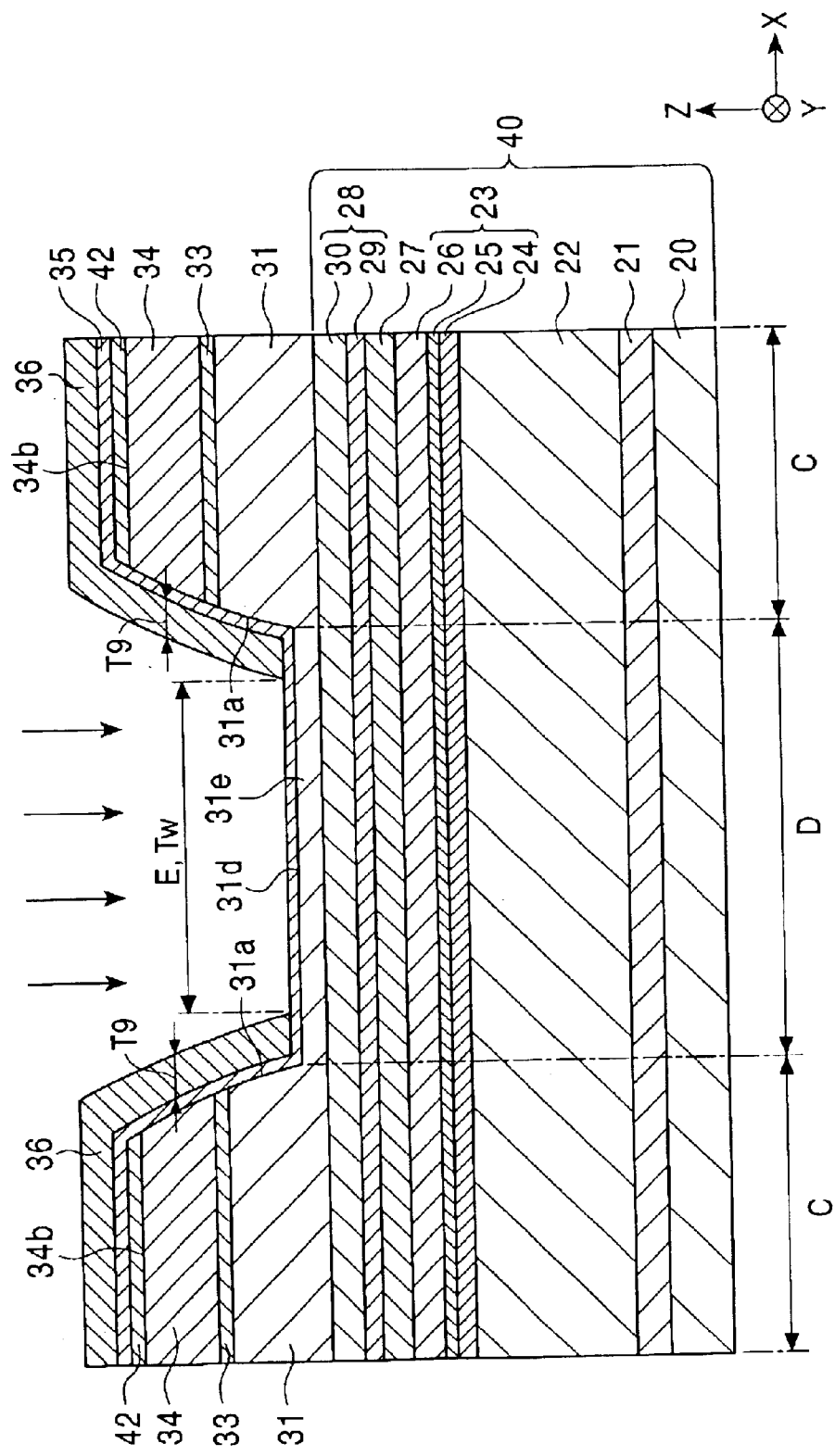
FIG. 15 is a schematic view showing a step following the step in FIG. 14.

Next, as shown by arrows in FIG. 15, ion milling is performed with an angle perpendicular (parallel to Z direction in the figure) or approximately perpendicular (0 to 20° inclined from the direction perpendicular to the individual surfaces of the layers forming the multilayer film) to the substrate 20. Alternatively, anisotropic etching is performed by reactive ion etching. In this step, until the solid second electrode film 36s formed at center E on the upper surface 31d of the connecting layer 31e is appropriately removed, ion milling or RIE is continued. By this ion milling or RIE, although parts of the solid second electrode film 36s formed above the upper surfaces 34b of the first electrode layers 34 are also removed, the solid second electrode film 36s having a small thickness is still likely to remain thereon. However, since the solid second electrode film 36s formed above the upper surfaces of the first electrode layers 34 is easily removed by ion milling as compared to that formed at the center E on the upper surface 31d of the connecting layer 31e, depending on the thickness of the solid second electrode film 36s formed by deposition, before the solid second electrode film 36s formed at the center E on the upper surface 31d of the connecting layer 31e is entirely removed, the solid second electrode film 36s formed above the upper surfaces 34b of the first electrode layers 34 may be entirely removed in some cases.

The solid second electrode film 36s formed on the internal end surfaces 34a of the first electrode layers 34 and the internal end surfaces 31 of the second antiferromagnetic layers 31 is also slightly removed; however, the thickness thereof is larger than that of the solid second electrode film 36s on the upper surface 31d of the connecting layer 31e, and in addition, the milling direction of ion milling is inclined with respect to the solid second electrode film 36s formed on the internal end surfaces 34a of the first electrode layers 34 and the internal end surfaces 31 of the second antiferromagnetic layers 31. Accordingly, the solid second electrode film 36s formed on the internal end surfaces 34a of the first electrode layers 34 and the internal end surfaces 31 of the second antiferromagnetic layers 31 is unlikely to be removed as compared to that formed on the upper surface 31d of the connecting layer 31e, and hence the solid second electrode film 36s having an appropriate thickness T9 is formed on the internal end surfaces 34a and 31a of the first electrode layers 34 and the second antiferromagnetic layers 31.

As shown in FIG. 15, the solid second stop film 35 is exposed at the center E at which the solid second electrode film 36s is removed. The solid second stop film 35 is formed, for example, of a material having an etching rate lower than that of the solid second electrode film 36s described above. Accordingly, overetching is performed for entirely removing the solid second electrode film 36s on the center E, the solid second stop film 35 appropriately protects the layer provided thereunder from the etching.

In the step of ion milling or RIE shown in FIG. 15, the solid second electrode film 36s formed on the internal end surfaces 34a of the first electrode layers 34 and the internal end surfaces 31a of the second antiferromagnetic layers 31 is evenly removed so that the thickness thereof at the left side and that at the right side are equivalent to each other. Hence, after the ion milling or RIE, the film thicknesses T9 of the solid second electrode film 36s, shown in FIG. 15, at the left side and the right side are equivalent to each other.

In addition, as shown in FIG. 15, when the solid second electrode film 36s at the center E is removed, parts of the solid second electrode film 36s thus formed extend along the internal end surfaces 34a and 31a to the two sides of the central portion D and serve as current paths through which sense current flows to the multilayer film 40. In addition, the width dimension in the track width direction (X direction in the figure) between the bottom portions of the parts of the solid second electrode film 36s is defined as the track width Tw.

By the step shown in FIG. 15, manufacturing of the magnetic sensor may be completed; however, as described with reference to FIG. 9, when this step is completed, since the solid second electrode film 36s still remains on the insulating layer 70 widely extending at the rear side in the height direction, it is preferable that this solid second electrode film 36s be appropriately removed.

When the step shown in FIG. 15 is completed, the solid second stop film 35 is exposed at the center E between the parts of the solid second electrode film 36s. As described above, this solid second stop film 35 is formed, for example, of a material having an etching rate lower than that of the solid second electrode film 36s. Accordingly, when the solid second electrode film 36s remaining on the insulating layer 70 shown in FIG. 9 is removed by etching, the solid second stop film 35 is influenced by this etching; however, when being formed so as to have an appropriate thickness, the entire solid second stop film 35 is not removed before the solid second electrode film 36s remaining on the insulating layer 70 is totally removed.

Figure 16:
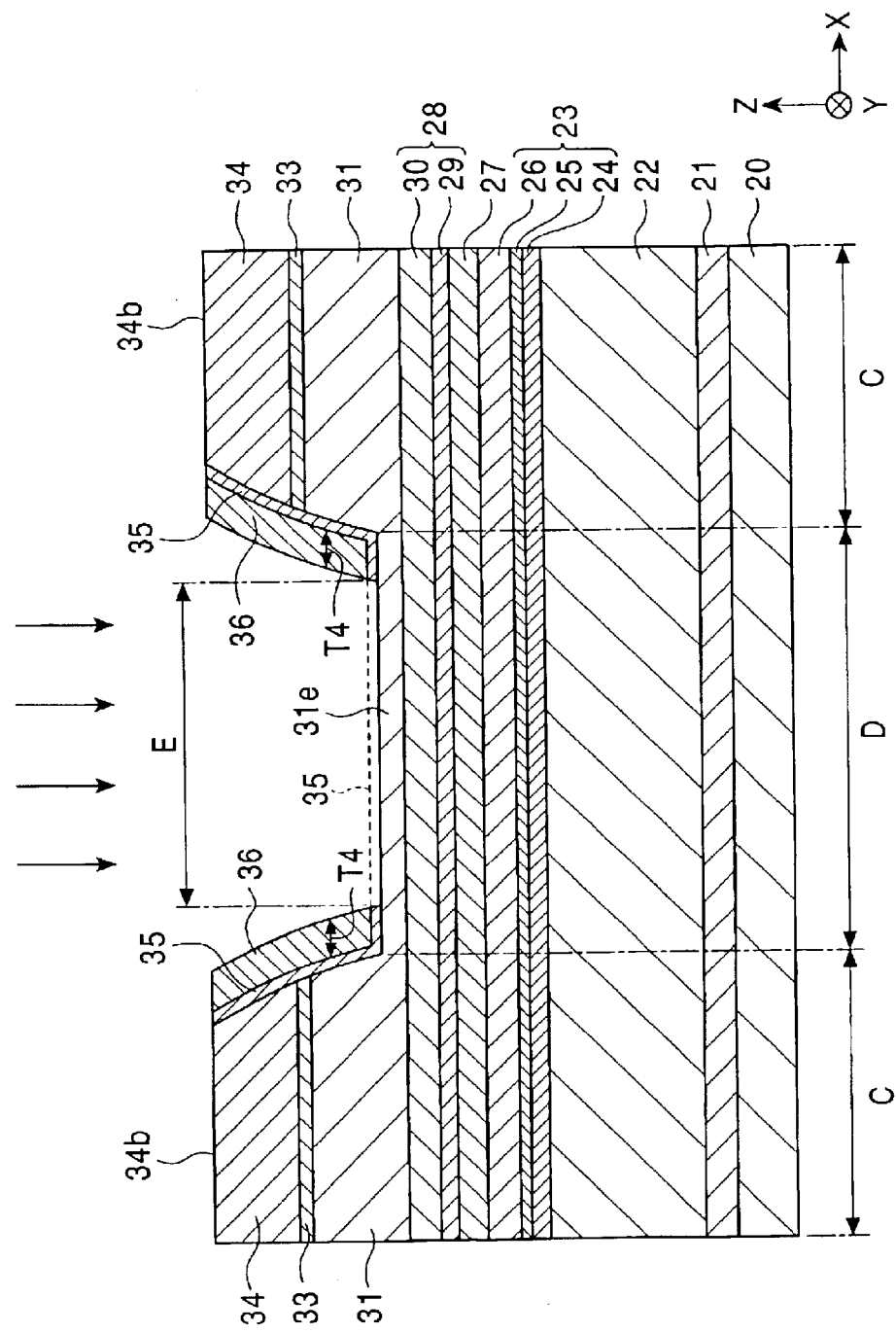
FIG. 16 is a schematic view showing a step following the step in FIG. 15.

In the step shown in FIG. 16, ion milling is further performed, and hence the solid second electrode film 36s remaining on the insulating layer 70 is removed. In this step, the solid second electrode film 36s formed above the upper surfaces 34b of the first electrode layers 34 with the mask layers 42 and the second stop layers 35 provided therebetween is also removed. When the solid second electrode film 36s remaining on the insulating layer 70 is entirely removed, the ion milling is stopped.

In FIG. 16, the solid second stop film 35 does not remain on the center E at all; however, as shown by a dotted line, part of the solid second stop film 35 may remain. In addition, on the first electrode layers 34, none of the mask layers 42 and the second stop layers 35 remain; however, as above, parts of them may also remain (this is not illustrated by a dotted line).

In addition, since the milling angle used in the milling shown in FIG. 16 is close to perpendicular to the substrate 20 (shown by the arrows), the solid second electrode film 36s formed on the internal end surfaces 34a of the first electrode layers 34 and the internal end surfaces 31 of the second antiferromagnetic layers 31 is not subject to the influence of this ion milling; however, the solid second electrode film 36s is slightly removed to have a thickness T4, and the thicknesses thereof at the left and the right sides are still equivalent to each other. This thickness T4 is the overlap length on the multilayer film 40, and in the present invention, the thickness T4 described above is preferably in the range of from 50 to 500 Å. When the milling shown in FIG. 16 is completed, the second electrode layers 36 are formed from the solid second electrode film 36s.

Next, second annealing in a magnetic field is performed. The magnetization direction in this step is the track width direction (X direction in the figure). In this second annealing in a magnetic field, a second magnetic field for application is set smaller than an exchange anisotropic magnetic field of the first antiferromagnetic layer 22, and in addition, the heat treatment temperature is set lower than the blocking temperature of the first antiferromagnetic layer 22. The second magnetic field is preferably set stronger than the saturated magnetic field of the free magnetic layer 28 and the antimagnetic field thereof. Accordingly, while the direction of the exchange anisotropic magnetic field of the first antiferromagnetic layer 22 is set in the height direction (Y direction in the figure), the direction of the exchange anisotropic magnetic field of the second antiferromagnetic layer 31 can be set in the track width direction (X direction in the figure). In this step, for example, the second heat treatment temperature is set to 250° C., and the intensity of the magnetic field is set to 24 kA/m.

By the second annealing in a magnetic field described above, transformation to regular lattices occurs appropriately in the second antiferromagnetic layers 31 at the two side portions C, and exchange coupling magnetic fields having an appropriate intensity are generated between the antiferromagnetic layers 31 at the two end portions C and the respective two end portions C of the free magnetic layer 28. Accordingly, the magnetizations of the free magnetic layer 28 at the two side portions C are fixed in the track width direction (X direction in the figure).

The second annealing in a magnetic field may be performed, for example, after the solid second stop film 35 is formed in the step shown in FIG. 14, or after the solid second electrode film 36s is formed.

Subsequently, as shown in FIG. 1, a Ta layer is continuously formed on the upper surfaces 34b of the first electrode layers 34, the second electrode layers 36, the second antiferromagnetic layers 31, and the connecting layer 31e, and is then oxidized, thereby forming an oxide used as the protective layer 37.

In the method for manufacturing the magnetic sensor shown in FIG. 2, after the step shown in FIG. 15, the magnetic sensor is covered, for example, with a resist layer, the insulating layer 70 shown in FIG. 9 is held without being covered with the resist layer, only the solid second electrode film 36s remaining on this insulating layer 70 is removed by ion milling, and subsequently, the resist layer is removed, whereby the magnetic sensor according to the embodiment shown in FIG. 2 is formed.

In the method for manufacturing the magnetic sensor, according to the present invention, it is not necessary to perform mask alignment twice, and the first electrode layers 34 and the second electrode layers 36 can be separately formed. In the step shown in FIG. 12, mask alignment is performed once, and the first electrode layers 34 each having a predetermined shape are formed on the second antiferromagnetic layers 31 at the two side portions C; however, when the second electrode layers 36 are formed in the steps shown in FIGS. 14 to 16, mask alignment is not necessary, and by performing only sputtering for film formation and ion milling or RIE, the second electrode layers 36 can be formed so that the film thicknesses thereof at the left side and the right side are equivalent to each other. Hence, an overlap structure in which the thicknesses of electrodes at the left and the right side are equivalent to each other can be formed precisely.

The reason for this is that the first electrode layers 34 and the second electrode layers 36 are formed separately. When these electrode layers are not formed separately, as is the case in the past, mask alignment must be performed twice, the alignment accuracy is degraded, and as a result, an overlap structure in which the thicknesses of electrodes at the left and the right side are equivalent to each other cannot be formed. In addition, in the present invention, assuming that the first electrode layers 34 are not formed, on the second antiferromagnetic layers 31, very thin second electrode layers 36 are formed, or the second electrode layers 36 are not formed at all. In this case, as current paths which conduct sense current to the second electrode layers 36 which overlap the multilayer film 40, the second antiferromagnetic layers 31 must be used, and as a result, the object to solve the problem in that element resistance is increased cannot be achieved.

That is, in the present invention, the first electrode layers 34 having a predetermined thickness, which are used as current paths for the second electrode layers 36, are formed on the second antiferromagnetic layers 31, and in a step separate from that for the first electrode layers 34, the second electrode layers 36 are formed so as to just overlap the multilayer film 40 (that is, the formation of the second electrode layers 36 on the second antiferromagnetic layers 31 is not the primary object). Accordingly, mask alignment is not necessary when the second electrode layers 36 are formed, and the second electrode layers 36 can be formed so that the thicknesses thereof at the left and the right side are equivalent to each other.

Next, in addition to the method shown in FIGS. 10 to 13, the antiferromagnetic layers 31 and the first electrode layers 34 can also be formed by the following method.

Figure 17:
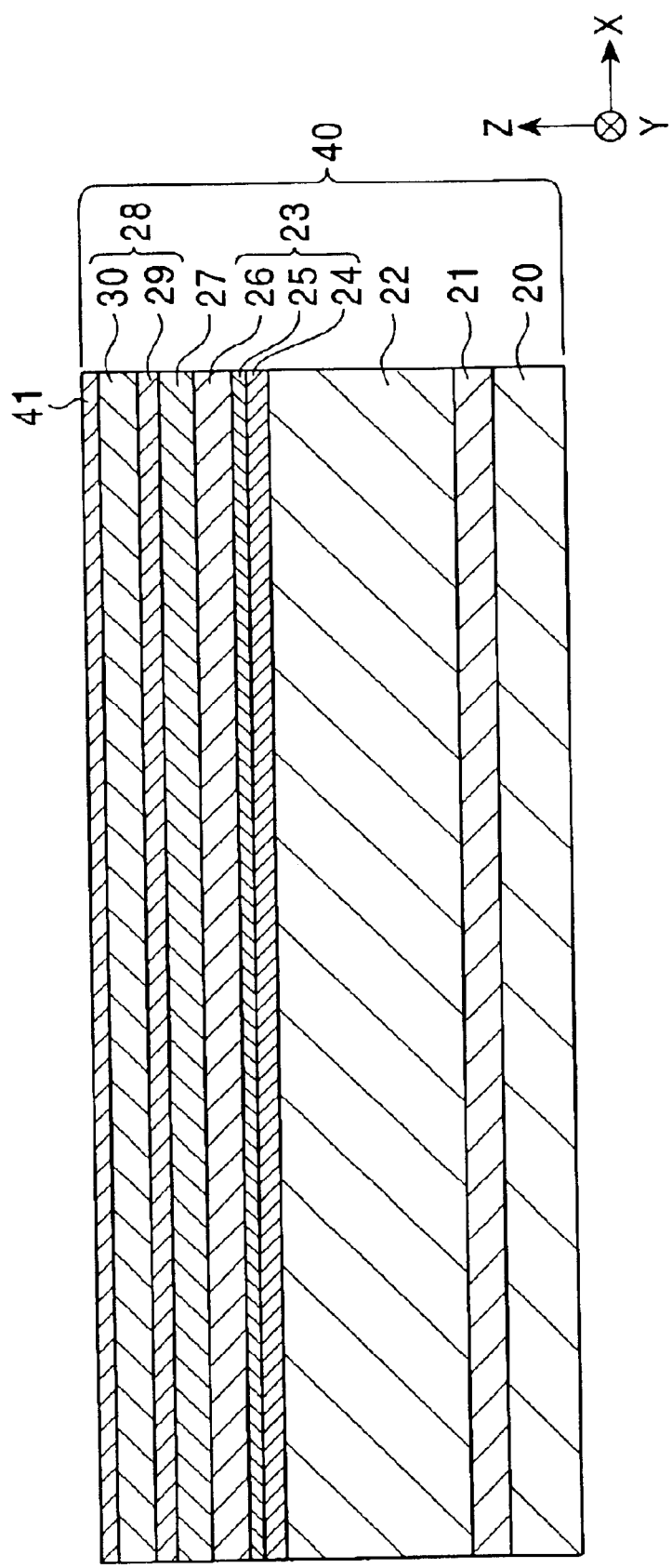
FIG. 17 is a schematic view showing a step of manufacturing the magnetic sensor shown in FIG. 3.

In a step shown in FIG. 17 (a partly cross-sectional view of a magnetic sensor in a manufacturing step, the sensor being viewed from an opposing face opposing a recording medium), on the substrate 20, the seed layer 21, the first antiferromagnetic layer 22, and the fixed magnetic layer 23 having an artificial ferrimagnetic structure, the nonmagnetic material layer 27, the free magnetic layer 28, and the nonmagnetic layer 41 are sequentially formed. The film formation may be performed by sputtering or vapor deposition.

The individual layers are equivalent to those described with reference to FIG. 10. The nonmagnetic layer 41 is preferably a dense layer that is not subject to oxidation when being exposed to the air. In addition, even when elements constituting the nonmagnetic layer 41 intrude into the ferromagnetic layer 51, the second antiferromagnetic layers 31, and the free magnetic layer 28 by thermal diffusion or the like, the elements preferably have properties that will not degrade the properties thereof as the antiferromagnetic layer and the ferromagnetic layer.

In the present invention, the nonmagnetic layer 41 is preferably formed of at least one noble metal selected from the group consisting of Ru, Re, Pd, Os, Ir, Pt, Au, and Rh.

The nonmagnetic layer 41 formed of a noble metal such as Ru is a dense layer that is unlikely to be oxidized even when being exposed to the air. Hence, even when the thickness of the nonmagnetic layer 41 is decreased, the free magnetic layer 28 is appropriately prevented from being oxidized.

In the present invention, the nonmagnetic layer 41 preferably has a thickness of 3 to 10 Å. Even when the nonmagnetic layer 41 has a small thickness as described above, the free magnetic layer 28 can be appropriately prevented from being oxidized.

In the present invention, since the nonmagnetic layer 41 is formed of a noble metal such as Ru having a small thickness of approximately 3 to 10 Å, at the stage of excavating the nonmagnetic layer 41 by ion milling, the ion milling can be performed with low energy, and ion milling control can be improved as compared to that in the past.

As shown in FIG. 17, after the individual layers including the nonmagnetic layer 41 are formed on the substrate 20, a first annealing in a magnetic field is performed. While a first magnetic field (Y direction in the figure) is applied in the direction perpendicular to the track width Tw (X direction in the figure), heat treatment at a first heat treatment temperature is performed so that an exchange coupling magnetic field between the first antiferromagnetic layer 22 and the magnetic layer 24 forming the fixed magnetic layer 23 is generated, and the magnetization of the magnetic layer 24 is fixed in the Y direction in the figure. The magnetization of the other magnetic layer 26 is fixed in the direction opposite to the Y direction shown in the figure by exchange coupling of the RKKY interaction effect acting between the magnetic layers 24 and 26. For example, the first heat treatment temperature is set to 270° C., and the intensity of the magnetic field is set to 800 kA/m.

Figure 18:
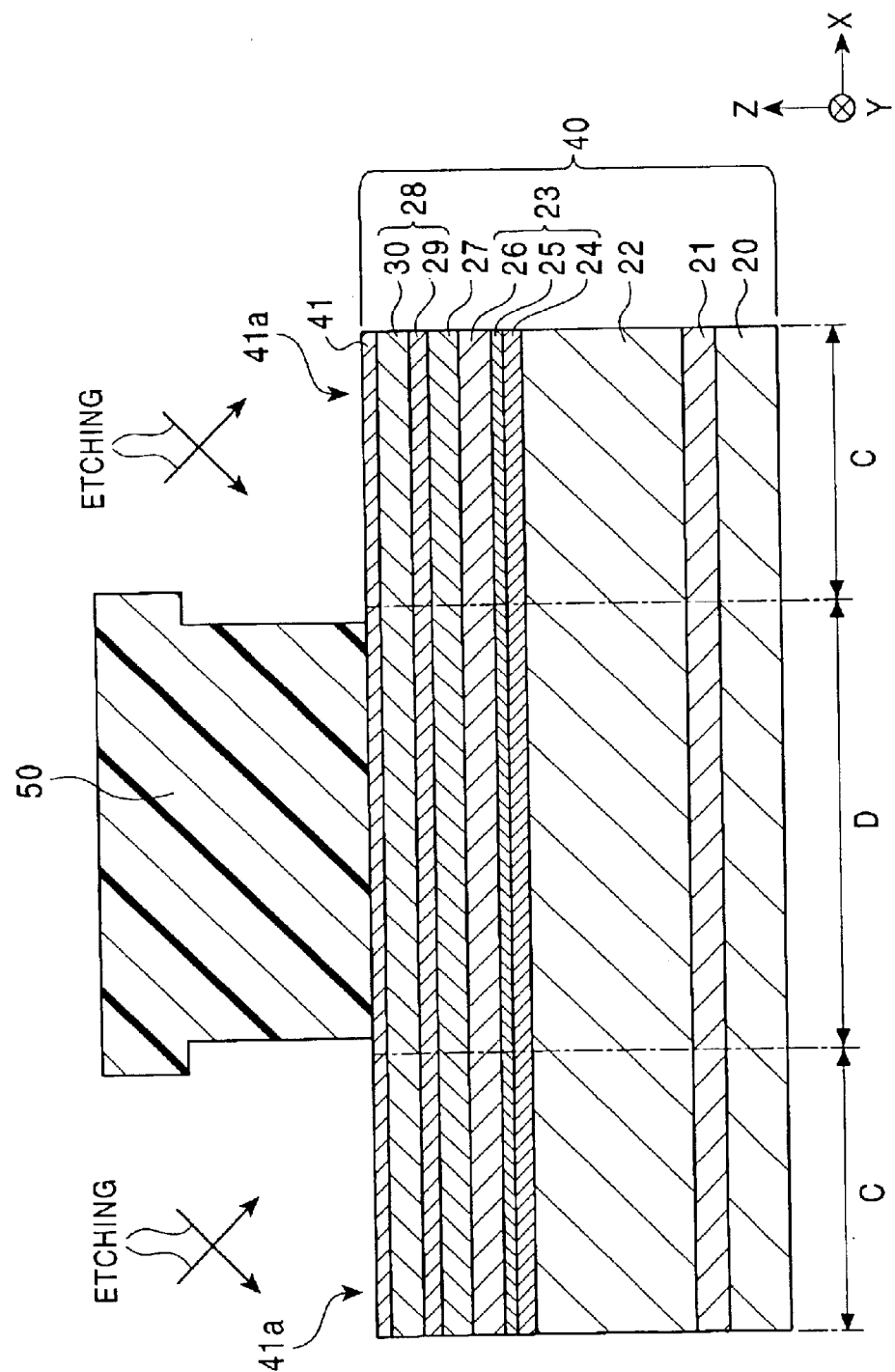
FIG. 18 is a schematic view showing a step following the step in FIG. 17.

Next, as shown in FIG. 18, a resist layer 50 for lift-off purpose is formed on the nonmagnetic layer 41. The width dimension of the resist layer 50 at the bottom surface in the track width direction (X direction in the figure) is approximately equivalent to that of the central portion D of the multilayer film 40.

Two side portions 41a of the nonmagnetic layer 41, which are not covered with the resist layer 50, are removed by ion milling. The reason the nonmagnetic layer 41 is removed in this step is that when the thicknesses thereof at the two side portions are not decreased as small as possible, appropriate interlayer coupling between the ferromagnetic layer 51 to be formed in the following step and the free magnetic layer 28 cannot be obtained.

In the present invention, in this ion milling step, the entire nonmagnetic layer 41 may be removed; however, when the thickness thereof is merely 3 Å or less, the nonmagnetic layer 41 may remain. When the nonmagnetic layer 41 is processed to have a small thickness as described above, appropriate interlayer coupling between the ferromagnetic layer 51 to be formed in the following step and the free magnetic layer 28 can be generated, and hence the magnetization control of the free magnetic layer 28 can be appropriately performed.

In the ion milling step shown in FIG. 18, low-energy ion milling is used. The reason for this is that the nonmagnetic layer 41 has a very small thickness of approximately 3 to 10 Å. In the present invention, even when the nonmagnetic layer 41 formed of Ru or the like has a very small thickness of approximately 3 to 10 Å, the free magnetic layer 28 formed thereunder can be sufficiently prevented from being oxidized, and the amount of the nonmagnetic layer 41 which is milled by the low-energy ion milling can be easily controlled.

Figure 19:
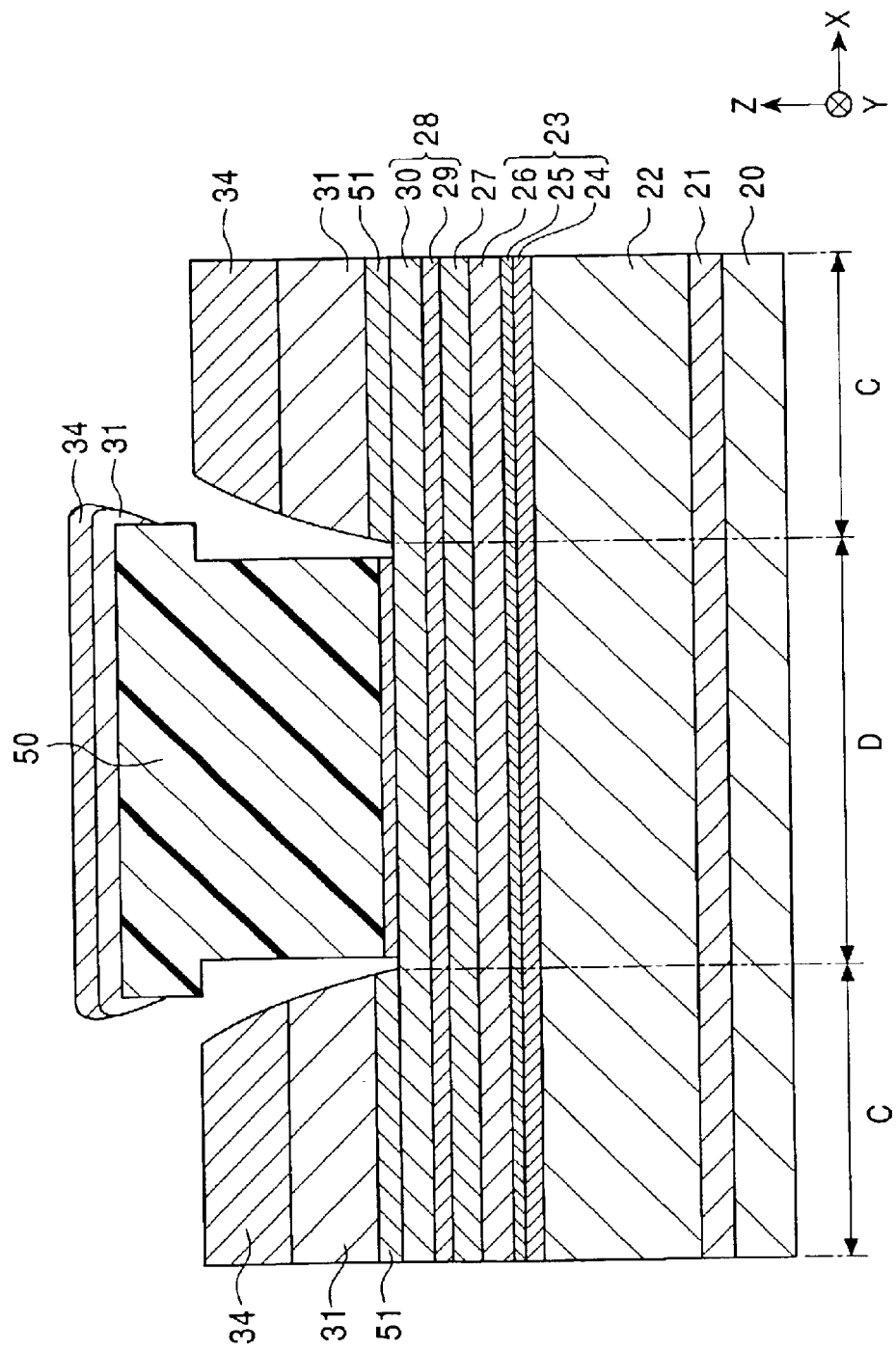
FIG. 19 is a schematic view showing a step following the step in FIG. 18.

After the two side portions 41a of the nonmagnetic layer 41 are removed by ion milling, on the two side portions C of the free magnetic layer 28 (or on the nonmagnetic layer 41 when remaining), the ferromagnetic layers 51, the second antiferromagnetic layers 31, and the first electrode layers 34 are sequentially formed by sputtering. The "sequential film formation by sputtering" means that the films are formed by sputtering while continuously maintaining an evacuated state. By sequentially forming the ferromagnetic layers 51 and the second antiferromagnetic layers 31 by sputtering, exchange coupling magnetic fields having an appropriate intensity can be generated therebetween, and by the interlayer coupling between the ferromagnetic layers 51 and the free magnetic layer 28, the magnetizations of the free magnetic layer 28 at the two side portions C can be fixed in the X direction in the figure. Subsequently, the resist layer 50 shown in FIG. 19 is removed. Next, by performing the steps shown in FIGS. 14 to 16, the second electrode layers 36 are each continuously formed on the internal end surface 34a of the first electrode layer 34, the internal end surface 31a of the second antiferromagnetic layer 31, and part of the upper surface of the multilayer film 40. Hence, the magnetic sensor shown in FIG. 3 can be manufactured.

In addition to the two manufacturing methods including the step of forming the first electrode layers 34 and the preceding steps described above, another method may be used. Depending on a manufacturing method including a step of forming the first electrode layers 34 and the preceding steps, the embodiment of the magnetic sensor may vary to some extent; however, although the variation is present, when the second electrode layers 36 are each continuously formed on the internal end surface 34a of the first electrode layer 34, the internal end surface 31a of the second antiferromagnetic layer 31, and a part of the upper surface of the multilayer film 40, the magnetic sensor is within the range of the present invention.

Figure 20:
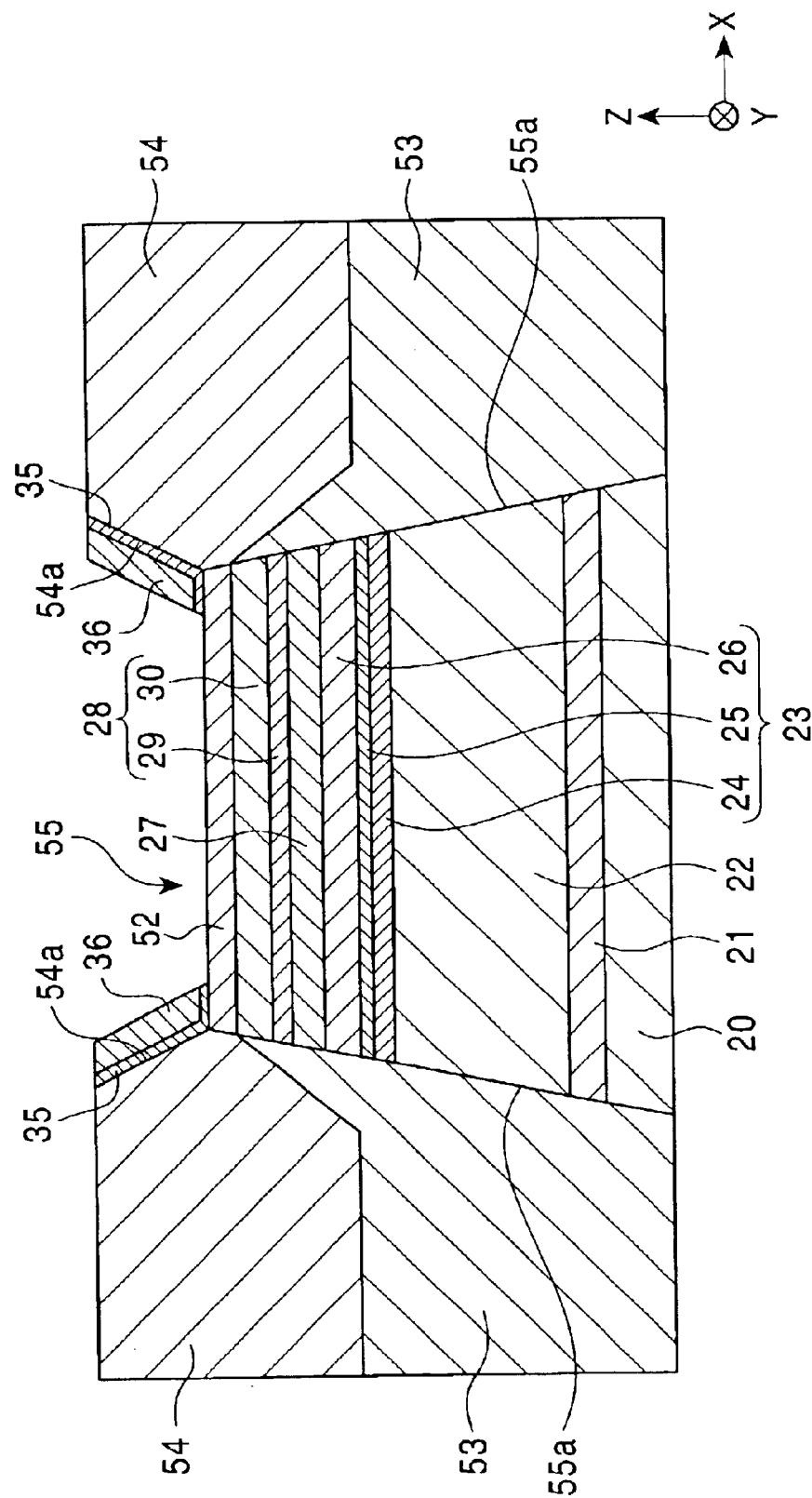
FIG. 20 is a partly cross-sectional view showing the structure of a magnetic sensor according to a fifth embodiment of the present invention, the sensor being viewed from an opposing face side opposing a recording medium.
Figure 21:
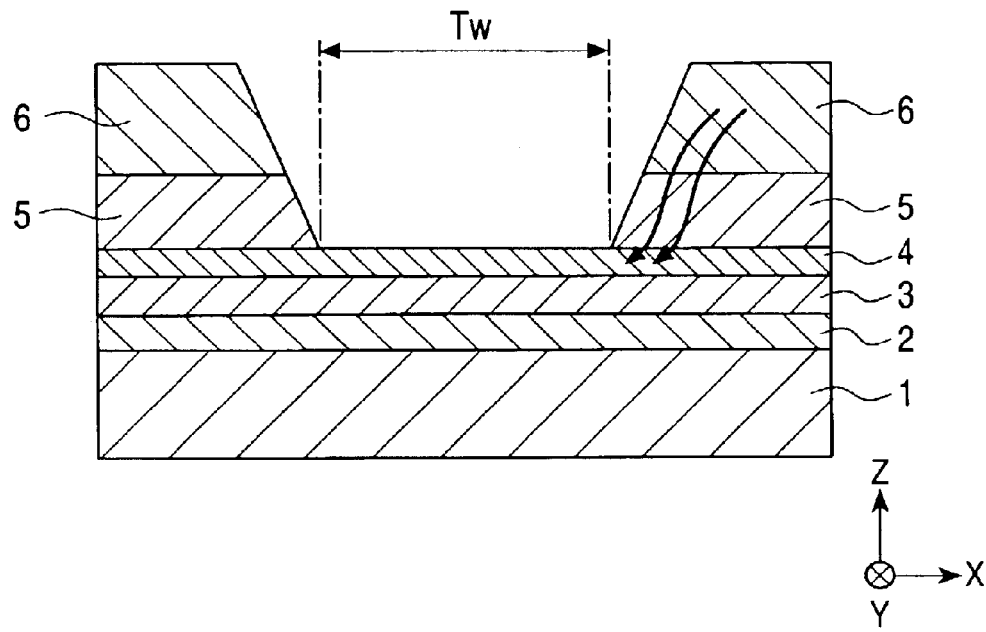
FIG. 21 is a partly cross-sectional view showing the structure of a related magnetic sensor viewed from an opposing face side opposing a recording medium.
Figure 22:
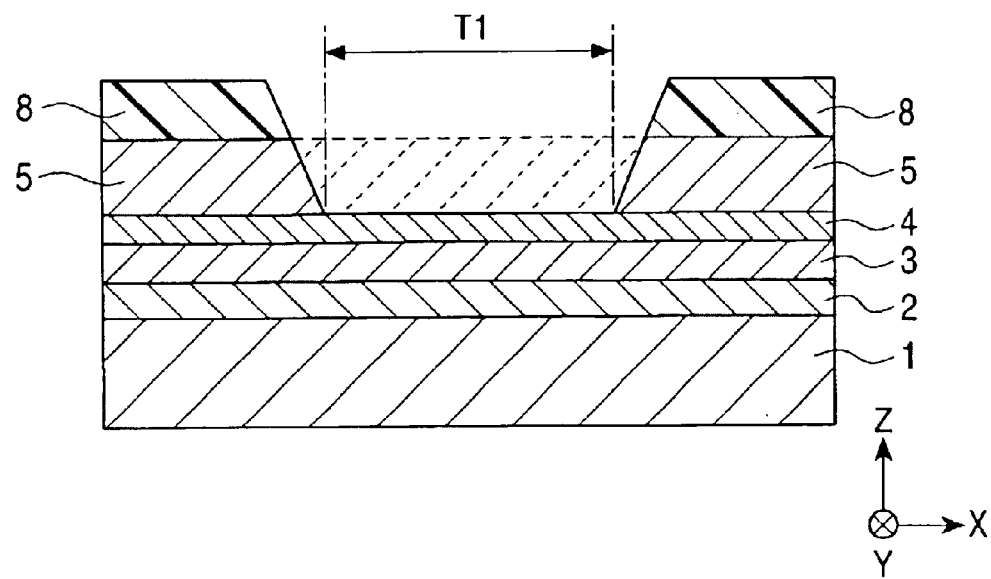
FIG. 22 is a schematic view showing a step of manufacturing another related magnetic sensor.

FIG. 20 is a partly cross-sectional view of a magnetic sensor viewed from an opposing face opposing a recording medium, the magnetic sensor having longitudinal bias means different from that of each of the magnetic sensors shown in FIGS. 1 to 3, and 8.

In the embodiment shown in FIG. 20, on the substrate 20, the seed layer 21, the first antiferromagnetic layer 22, the fixed magnetic layer 23 having an artificial ferrimagnetic structure, the nonmagnetic material layer 27, the free magnetic layer 28, and a protective layer 52 are provided in that order, thereby forming a multilayer film 55. Materials and the like for the individual layers are equivalent to those described with reference to FIG. 1, and descriptions thereof are omitted. The protective layer 52 is formed of Ta or the like.

In the embodiment shown in FIG. 20, from the lower side to the upper side (Z direction in the figure), the distance between two end surfaces 55a in the track width direction (X direction in the figure) of the multilayer film 55 is gradually decreased so that inclined or curved surfaces are formed.

As shown in FIG. 20, at two sides of the multilayer film 55 in the track width direction (X direction in the figure), hard bias layers 53 are formed. The hard bias layers 53 are each a permanent magnet film formed, for example, of a CoPt alloy or a CoPtCr alloy, and the magnetization of the free magnetic layer 28 is aligned in the track width direction (X direction in the figure) by a longitudinal bias magnetic field from the hard bias layers 53.

On the hard bias layers 53, first electrode layers 54 are formed. The first electrode layer 54 is preferably formed of an alloy of Au containing at least one of Pd and Cr, or at least one of Cr, Rh, Ru, Ta, and W. Accordingly, the ductility of the first electrode layer 54 can be decreased, and when the opposing face of the magnetic sensor, opposing a recording medium, is polished when a slider is formed, short circuiting, which is caused by the generation of smearing in the first electrode layer 54, between the first electrode layer 54 and an upper shield layer or a lower shield layer can be appropriately prevented.

In the embodiment shown in FIG. 20, the internal end surfaces 54a of the first electrode layers 54 are located above the upper surface of the multilayer film 55, and the second electrode layers 36 are formed on the respective internal end surfaces 54a of the first electrode layers 54 with the stop layers (equivalent to the second stop layers in FIG. 1) 35 provided therebetween. The second electrode layers 36 are formed extending to the upper surface of the multilayer film 55, and the distance between the second electrode layers 36 in the track width direction (X direction in the figure) defines the track width Tw.

In the embodiment shown in FIG. 20, after the first electrode layers 54 are formed, by using the steps shown in FIGS. 14 to 16, the second electrode layers 36 can be continuously formed on the respective internal end surfaces 54a of the first electrode layers 54 and parts of the upper surface of the multilayer film 55.

According to the present invention, the second electrode layers 36 provided at two sides in the track width direction, which have the thicknesses equivalent to each other and which overlap the multilayer film 55, can be precisely formed. The reason for this is that a manufacturing method in which mask alignment is performed twice for forming the electrode layers is not used, and hence while fulfilling recent narrower track requirement, the magnetic sensor of the embodiment according to the present invention can simultaneously achieve the decrease in element resistance and the reduction of generation of side reading.

In addition, the magnetic sensor of the present invention may be used in various applications such as that used in a magnetic head embedded in a hard disc device.

As has been thus described, in the magnetic sensor of the present invention, since the first electrode layers, which are formed on the second antiferromagnetic layers, and the second electrode layers, which are provided on the respective internal end surfaces of the second antiferromagnetic layers and the first electrode layers and the upper surface of the multilayer film, are formed separately, it is not necessary to perform mask alignment twice, and as a result, an overlap structure in which the second electrodes at the left and the right side have the thicknesses equivalent to each other can be precisely formed.

In the present invention, since the firs electrode layers and the second electrode layers can be formed separately, different materials may be used therefor, and for example, the first electrode layers may be formed of a nonmagnetic conductive material having ductility lower than that for the second electrode layers. Accordingly, in a polishing step of slider formation, the generation of smearing can be suppressed, and as a result, a magnetic sensor having superior reproduction characteristics can be manufactured.

As described above, in the present invention, since the overlap structure in which the electrodes at the left and the right side have the thicknesses equivalent to each other can be formed, which is superior to an overlap structure formed in the past, in particular, while fulfilling the narrower track requirement, the decrease in element resistance and the reduction of generation of side reading can be effectively achieved, and in addition, a magnetic sensor having superior reproduction output can be manufactured.

What is claimed is:

1. A magnetic sensor having a multilayer film which includes a first antiferromagnetic layer, a fixed magnetic layer, a nonmagnetic material layer, and a free magnetic layer provided in that order from the bottom, the magnetic sensor comprising:
    second antiferromagnetic layers which are disposed with a predetermined space provided therebetween in a track width direction and which are provided on an upper surface of the multilayer film; first electrode layers formed on the second antiferromagnetic layers; and
    second electrode layers disposed with a predetermined space provided therebetween in the track width direction, the second electrode layers being provided one or directly on and indirectly above at least internal end surfaces in the track width direction of the first electrode layers and the second antiferromagnetic layers and parts of the upper surface of the multilayer film.

2. A magnetic sensor according to claim 1, wherein the first electrode layers are formed in a step separate from that of the second electrode layers.

3. A magnetic sensor according to claim 1, wherein the first electrode layers are formed of a material different from that of the second electrode layers.

4. A magnetic sensor according to claim 3, wherein the first electrode layers are formed of a material having ductility lower than that of the second electrode layers.

5. A magnetic sensor according to claim 4, wherein the first electrode layers are formed of at least one of Cr, Rh, Ru, Ta, and W, or an alloy of Au containing at least one of Pd and Cr, and the second electrode layers are formed of at least one of Au, Cu, and Ag.

6. A magnetic sensor according to claim 1, wherein the second electrode layers are formed only on the internal end surfaces and the parts of the upper surface of the multilayer film.

7. A magnetic sensor according to claim 1, further comprising stop layers, wherein the stop layers are provided under the second electrode layers.

8. A magnetic sensor according to claim 7, wherein the stop layers have an etching rate lower than that of the second electrode layers.

9. A magnetic sensor according to claim 7, wherein the stop layers are formed of at least one element selected from the group consisting of Ta, Cr, V, Nb, Mo, W, Fe, Co, Ni, Pt, and Rh.

10. A magnetic sensor according to claim 7, wherein the stop layers each have a laminate structure composed of a Cr layer and a Ta layer provided in that order from the bottom.

11. A magnetic sensor according to one of claims 1 to 10, wherein the internal end surfaces of the second antiferromagnetic layers and the internal end surfaces of the first electrode layers form continuous surfaces.

12. A method for manufacturing a magnetic sensor, comprising:
    step (a) of forming a multilayer film including a first antiferromagnetic layer, a fixed magnetic layer, a nonmagnetic material layer, and a free magnetic layer provided in that order on a substrate;
    step (b) of forming second antiferromagnetic layers, which are disposed on two side portions of the multilayer film in a track width direction, and first electrode layers on the second antiferromagnetic layers; and
    step (c) of forming second electrode layers one of directly on and indirectly above at least internal end surfaces in the track width direction or the first electrode layers and the second antiferromagnetic layers and parts of an upper surface of the multilayer film, the second electrode layers being provided with a predetermined space provided therebetween in the track width direction.

13. A method for manufacturing a magnetic sensor, comprising:
    step (a) of forming a multilayer film including a first antiferromagnetic layer, a fixed magnetic layer, a nonmagnetic material layer, and a free magnetic layer provided in that order on a substrate;
    step (b) of forming second antiferromagnetic layers, which are disposed on two side portions of the multilayer film in a track width direction, and first electrode layers on the second antiferromagnetic layers;
    step (d) of forming a solid second electrode film on upper surfaces of the first electrode layers, internal end surfaces in the track width direction or the first electrode layers and the second antiferromagnetic layers, and an upper surface of the multilayer film; and
    step (e) of removing a center part of the solid second electrode film formed on the upper surface of the multilayer film, whereby second electrode layers with a predetermined space provided therebetween in the track width direction are formed on the internal end surfaces and parts of the upper surface of the multilayer film.

14. A method for manufacturing a magnetic sensor, according to claim 13, further comprising forming a solid stop film on the upper surfaces of the first electrode layers, the internal end surfaces in the track width direction of the first electrode layers and the second antiferromagnetic layers, and the upper surface of the multilayer film after step (b) is performed; and
    after part of the solid stop film is exposed by removing the center part of the solid second electrode film in step (e), removing the part of the solid stop film.

15. A method for manufacturing a magnetic sensor, according to claim 14, wherein the solid stop film is formed of a material having an etching rate lower than that of the solid second electrode film.

16. A method for manufacturing a magnetic sensor, according to claim 13, wherein the solid stop film is formed of at least one element selected from the group consisting of Ta, Cr, V, Nb, Mo, W, Fe, Co, Ni, Pt, and Rh.

17. A method for manufacturing a magnetic sensor, according to claim 14, wherein the solid stop film is formed of a Cr layer and a Ta layer provided in that order from the bottom.

18. A method for manufacturing a magnetic sensor, according to claim 14, wherein parts of the solid second electrode film formed on the upper surfaces of the first electrode layers are entirely removed in step (e).

19. A method for manufacturing a magnetic sensor, according to claim 13, wherein the solid second electrode film is formed in step (d) by sputtering with a sputtering angle inclined from a direction perpendicular to the substrate, whereby a thickness of the solid second electrode film on the internal end surfaces is larger than each of those on the upper surface of the multilayer film and on the upper surfaces of the first electrode layers.

20. A method for manufacturing a magnetic sensor, according to claim 19, wherein the solid second electrode film is formed in step (d) so that the thickness thereof on the upper surface of the multilayer film is smaller than each of those on the upper surfaces of the first electrode layers.

21. A method for manufacturing a magnetic sensor, according to claim 19, wherein, in step (e) of removing the center part of the solid second electrode film, formed on the upper surface of the multilayer film, by milling, a milling angle is set close to perpendicular to the substrate as compared to a sputtering angle used for forming the solid second electrode film.

22. A method for manufacturing a magnetic sensor, according to claim 12, wherein the first electrode layers are formed of a nonmagnetic conductive material different from that of the second electrode layers.

23. A method for manufacturing a magnetic sensor, according to claim 22, wherein the first electrode layers are formed of a material having ductility lower than that of the second electrode layers.

24. A method for manufacturing a magnetic sensor, according to claim 23, wherein the first electrode layers are formed of at least one of Cr, Rh, Ru, Ta, and W, or an alloy of Au containing at least one of Pd and Cr, and the second electrode layers are formed of at least one or Au, Cu, and Ag.

\* \* \* \* \*